(12) United States Patent
Sameshima et al.

(10) Patent No.: US 8,389,406 B2
(45) Date of Patent: Mar. 5, 2013

(54) METHOD OF MANUFACTURING SEMICONDUCTOR DEVICE

(75) Inventors: Hideyuki Sameshima, Tokyo (JP); Tomoo Ono, Tokyo (JP)

(73) Assignee: Lapis Semiconductor Co., Ltd., Tokyo (JP)

( * ) Notice: Subject to any disclaimer, the term of this patent is extended or adjusted under 35 U.S.C. 154(b) by 300 days.

(21) Appl. No.: 12/656,629

(22) Filed: Feb. 5, 2010

(65) Prior Publication Data

US 2010/0210103 A1 Aug. 19, 2010

(30) Foreign Application Priority Data

Feb. 13, 2009 (JP) ................................. 2009-032035

(51) Int. Cl.
*H01L 21/44* (2006.01)

(52) U.S. Cl. ........ 438/675; 438/622; 438/669; 438/674; 438/678; 438/672; 257/E21.575; 257/E21.582; 257/E21.585; 257/E21.586; 257/E21.587; 257/E23.168; 257/E23.142; 257/E23.145; 257/758; 257/776

(58) Field of Classification Search .................. 438/622, 438/674, 672, 675, 678, 669; 257/758, 776, 257/E23.168, E23.142–E23.145, E21.575, 257/E21.582, E21.585–E21.587
See application file for complete search history.

(56) References Cited

U.S. PATENT DOCUMENTS

| 7,659,193 B2 * | 2/2010 | Hu et al. ........................ 438/614 |
| 2008/0001290 A1 * | 1/2008 | Chou et al. .................... 257/751 |

FOREIGN PATENT DOCUMENTS

| JP | 3-181195 | 8/1991 |
| JP | 2002-252310 A | 9/2002 |

* cited by examiner

*Primary Examiner* — Kimberly Rizkallah
*Assistant Examiner* — Maria Ligai
(74) *Attorney, Agent, or Firm* — Rabin & Berdo, P.C.

(57) ABSTRACT

There is provided a method of manufacturing a semiconductor device including: preparing a semiconductor substrate, forming a first insulating layer, a first redistribution layer, a second insulating layer, a second redistribution layer, and at least one of first processing, in which, after the first electrically conductive material is filled in the first opening to form a first via interconnect, the first redistribution layer is formed on the first insulating layer with the first electrically conductive material such that the first redistribution layer is electrically connected to the first via interconnect; or second processing, in which, after the second electrically conductive material is filled in the second opening to form a second via interconnect, the second redistribution layer is formed on the second insulating layer with the second electrically conductive material such that the second redistribution layer is electrically connected to the second via interconnect.

11 Claims, 46 Drawing Sheets

METHOD OF MANUFACTURING SEMICONDUCTOR DEVICE

CROSS-REFERENCE TO RELATED APPLICATION

This application is based on and claims priority under 35 USC 119 from Japanese Patent Application No. 2009-032035 filed on Feb. 13, 2009, the disclosure of which is incorporated by reference herein.

BACKGROUND

1. Technical Field

The present invention relates to method of manufacturing a semiconductor device, and in particular to a method of manufacturing a WCSP semiconductor device having a multilayer redistribution structure.

2. Related Art

In conventional integrated circuit packages of packaged semiconductor chips, such as semiconductor integrated circuits and the like, demands are increasing for size reduction and reduction in thickness. Recently, development is progressing in Chip Sized Packages (CSP's), centered around integrated circuit packages in fields with particular demands for reduced thickness. CSP's have spherical shaped external connection terminals, called bumps, disposed in a lattice on the surface of a semiconductor chip. A structural body that includes plural individual semiconductor devices formed on a semiconductor wafer by wafer processing, from which CSP's are obtained by dicing, is referred to as a WCSP (Wafer-level Chip Size Package).

Recently, multilayer redistribution structures are being introduced even in WCSP's, in order to obtain a higher degree of integration. In such multilayer redistribution structure WCSP's, in order to obtain an even higher degree of integration, a "stacked structure", formed by via portions corresponding to each layer superimposed on an electrode pad, is proposed (Japanese Patent Application Laid-Open (JP-A) No. 2002-252310).

FIG. 45 is an example of a structure of a WCSP semiconductor of multilayer redistribution structure having a stacked structure. This semiconductor device 200 is equipped with: a semiconductor wafer 210; an electrode pad 212; a passivation film 214; a first insulation layer 216; a first opening 216a; a first Under Bump Metal (UBM) layer 218; a first redistribution layer 220; a second insulating layer 222; second openings 222a; a second UBM layer 224; a second redistribution layer 226; and a post electrode 228.

Next, a conventional method of manufacturing the WCSP semiconductor device 200 will be briefly explained, with reference to FIG. 45. First, the electrode pad 212 is formed to the surface of the semiconductor wafer 210; and the passivation film 214 is formed thereon, so as to expose the electrode pad 212 (Process 1). Next, the photosensitive first insulation layer 216 (PBO or the like) is formed on the surface of the semiconductor wafer 210, for example by spin coating, and a first opening 216a is formed by photo-exposure and development, so as to expose the electrode pad 212 (Process 2). The first opening 216a corresponds to a "first via portion".

Next, the first UBM layer 218, of titanium (Ti) and copper (Cu), and a first resist film are deposited in sequence. The first UBM layer 218 is a layer in which a first electrically conductive material (Cu) that will later be used for the first redistribution layer 220, is deposited on a first seed layer (Ti). After patterning the first resist film with the desired redistribution pattern by photo-exposure and development, the first redistribution layer 220 is formed by growing the first electrically conductive material using electroplating. The first resist film, the first electrically conductive material at portions that have not been grown as the first redistribution layer 220, and the first seed layer are removed in sequence, completing the first redistribution layer 220 (Process 3). Note than at this stage the first redistribution layer 220 has a structure that dips inwards into the first via portion. A portion of the surface of the first redistribution layer 220 dips in further than the surface of the first insulation layer 216.

Next, after the photosensitive second insulating layer 222 (PBO or the like) has been formed on the first redistribution layer 220, the second openings 222a are formed by photo-exposure and development processing, exposing the first redistribution layer 220 at the bottom face of the first via portion. The second opening 222a corresponds to the "second via portion". This second via portion is superimposed on the first via portion, configuring a "stacked structure 230". Then, similar to forming the first redistribution layer 220, the second UBM layer 224, of titanium (Ti) and copper (Cu), and a second resist film, are deposited in sequence. The second UBM layer 224 is a layer in which a second electrically conductive material (Cu) that will later be used for the second redistribution layer 226, is deposited on a second seed layer (Ti).

After patterning the second resist film with the desired redistribution pattern using photo-exposure and development, the second redistribution layer 226 is formed by growing the second electrically conductive material using electroplating. When this is being performed, in order to form a stacked structure, the second resist film is patterned so as to open the region above where the first via portion and the second via portion are formed (Process 4).

Next, the second redistribution layer 226 is formed by growing the second electrically conductive material using electroplating. The second resist film, the second electrically conductive material at portions that have not been grown as the second redistribution layer 226, and the second seed layer are removed in sequence, completing the second redistribution layer 226 (Process 5). The second redistribution layer 226 has a structure that dips inwards into the second via portion. A portion of the surface of the second redistribution layer 226 dips further inward than the surface of the second insulating layer 222. Multilayer redistribution layers are similarly formed in sequence, and finally the post electrode 228, a protective film, and an external terminal are formed, obtaining the WCSP (Process 6).

However, in the conventional manufacturing method, as shown in FIG. 46, the size of the openings at each of the vertically superimposed via portions in the stacked structure 230 is extremely small. Portions also arise where the via portion of the layer above dips deeply inward at each superimposition of the first via portion and the second via portion. Due to these circumstances, as the number of via portions stacked increases, penetration of the electroplating liquid into the via portion gets more difficult.

For example, as described above (Process 5), the first redistribution layer 220 dips inward into the first via portion, and a portion of the surface of the first redistribution layer 220 dips in further than the surface of the first insulation layer 216. Consequently, a portion with deep localized dipping can arise at the second via portion superimposed on the first via portion. Therefore, when the second electrically conductive material of the second UBM layer 224 is grown, penetration of the electroplating liquid into the second via portion is difficult.

Unless the required amount of electroplating liquid is supplied to the second via portion the second electrically conductive material cannot be grown to the desired thickness. Consequently, as shown in FIG. 28, the thickness of electroplating at the via portion of the second redistribution layer 226 is locally thinner than the thickness of the electroplating at the redistribution pattern portion, and film forming defects occur between the layers, called "fault-breaks". This results in occurrences of poor electrical connection between the second via portion and the first via portion, or, in other words, increased resistance of the stacked via.

SUMMARY

The present invention is made in order to solve the above issues, and an object of the present invention is, in a WCSP semiconductor device of multilayer redistribution structure having a stacked structure, to suppress occurrences of poor electrical connection at the stacked structure.

A first aspect of the present invention provides a method of manufacturing a semiconductor device, the method including:

preparing a semiconductor substrate formed with an electrode pad on a main surface side;

forming a first insulating layer from an insulating material so as to cover the electrode pad and the semiconductor substrate, the first insulating layer provided with a first opening through which a portion of the electrode pad is exposed;

forming a first redistribution layer on the first opening and on the first insulating layer from a first electrically conductive material;

forming a second insulating layer from an insulating material, the second insulating layer provided with a second opening through which a portion of the first redistribution layer that is superimposed on the first opening is exposed, and the second insulating layer being formed so as to cover portions of the first redistribution layer other than those of the second opening and to cover the first insulating layer;

forming a second redistribution layer on the second opening and on the second insulating layer from a second electrically conductive material; and at least one of first processing when forming the first redistribution layer, in which, after the first electrically conductive material is filled in the first opening to form a first via interconnect, the first redistribution layer is formed on the first insulating layer with the first electrically conductive material such that the first redistribution layer is electrically connected to the first via interconnect; or second processing when forming the second redistribution layer, in which, after the second electrically conductive material is filled in the second opening to form a second via interconnect, the second redistribution layer is formed on the second insulating layer with the second electrically conductive material such that the second redistribution layer is electrically connected to the second via interconnect.

A second aspect of the present invention provides the method of the first aspect, wherein the first processing including:

forming a first electrically conductive layer containing the first electrically conductive material so as to cover the electrode pad and the first insulating layer;

forming a resist film on the first electrically conductive layer other than in a region where the first opening is formed;

filling the first electrically conductive material in the first opening and forming the first via interconnect by growing the first electrically conductive material using an electroplating method until a surface of the first electrically conductive material becomes higher than a surface of the first insulating layer and then removing the resist film;

forming a resist film on the first electrically conductive layer other than in a region where the first redistribution layer is to be formed; and growing the first electrically conductive material on the first electrically conductive layer using an electroplating method, and forming the first redistribution layer electrically connected to the first via interconnect either before or after removing the resist film.

A third aspect of the present invention provides the method of the first aspect, wherein the second processing including:

forming a second electrically conductive layer containing the second electrically conductive material so as to cover the first redistribution layer and the first insulating layer;

forming a resist film on the second electrically conductive layer other than in a region where the second opening is formed;

filling the second electrically conductive material in the second opening and forming the second via interconnect by growing the second electrically conductive material using an electroplating method until a surface of the second electrically conductive material becomes higher than a surface of the second insulating layer, then removing the resist film;

forming a resist film on the second electrically conductive layer other than in a region where the second redistribution layer is to be formed; and growing the second electrically conductive material on the second electrically conductive layer using an electroplating method and forming the second redistribution layer electrically connected to the second via interconnect, either before or after removing the resist film.

A fourth aspect of the present invention provides the method of the first aspect, wherein the first processing including:

depositing the first electrically conductive material so as to cover the electrode pad and the first insulating layer up to a height of the surface of the first insulating layer or higher;

forming a resist film on the deposited film corresponding to the first opening;

forming the first via interconnect by employing the resist film to remove the first electrically conductive material on the surface of the first insulating layer; and forming the first redistribution layer electrically connected to the first via portion by depositing the first electrically conductive material on the first insulating layer and on the first via interconnect.

A fifth aspect of the present invention provides the method of the first aspect, wherein the second processing including:

depositing the second electrically conductive material so as to cover the first redistribution layer and the first insulating layer up to the height of the surface of the second insulating layer or higher;

forming a resist film on the deposited film corresponding to the second opening;

forming the second via interconnect by employing the resist film to remove the second electrically conductive material on the surface of the second insulating layer; and forming the second redistribution layer electrically connected to the second via portion by depositing the second electrically conductive material on the second insulating layer and on the second via interconnect.

A sixth aspect of the present invention provides the method of the fourth aspect, wherein the first electrically conductive material is deposited by sputtering.

A seventh aspect of the present invention provides the method of the first aspect, wherein the first electrically conductive material and the second electrically conductive material each comprises copper.

The following effects are exhibited by the present invention.

According to the first aspect of the present invention, in a WCSP semiconductor device of multilayer redistribution structure having a stacked structure, an effect is exhibited of suppressing occurrences of poor electrical connection at the stacked structure.

According to the second aspect of the present invention, in a semiconductor device having a stacked structure where the influence from the base substrate pattern is large, an effect is exhibited of suppressing occurrences of poor electrical connection overall by reducing film forming defects in lower redistribution layers, by performing electroplating in two stages.

According to the third aspect of the present invention, in semiconductor devices having a stacked structure where penetration of the electroplating liquid is more difficult for the via portions of upper layers and film forming defects readily occur, an effect is exhibited of being able to reduce the final number of occurrences of poor electrical connection by reducing film forming defects in the upper redistribution layer, by performing electroplating in two stages.

According to the fourth aspect of the present invention, in a method of depositing the electrically conductive material (referred to below as the "depositing method") an effect is exhibited of enabling good interconnect connections to be obtained even in a stacked structure, without localized insufficiencies in supply amount that can arise in electroplating. Furthermore, by reducing film forming defects in the lower redistribution layer, an effect is exhibited of suppressing occurrences of poor electrical connection overall.

According to the fifth aspect of the present invention, in the depositing method an effect is exhibited of enabling good interconnect connections to be obtained even in a stacked structure, without localized insufficiencies in supply amount that can arise in electroplating. Furthermore, by reducing film forming defects in the upper redistribution layer, an effect is exhibited of reducing the final number of occurrences of poor electrical connection.

According to the sixth aspect of the present invention, since sputtering is physical film forming that does not employ a chemical reaction, an effect is exhibited of being able to readily obtain good adhesion, no matter what the base substrate pattern is.

According to the seventh aspect of the present invention, since resistance to conduction is lower for copper lines, compared to aluminum lines, an effect is exhibited of excellent electrical connection characteristics.

BRIEF DESCRIPTION OF THE DRAWINGS

Exemplary embodiments of the present invention will be described in detail based on the following figures, wherein.

DETAILED DESCRIPTION

A detailed explanation will now be given of an exemplary embodiment of the present invention, with reference to the drawings.

First Exemplary Embodiment

Figure 1:
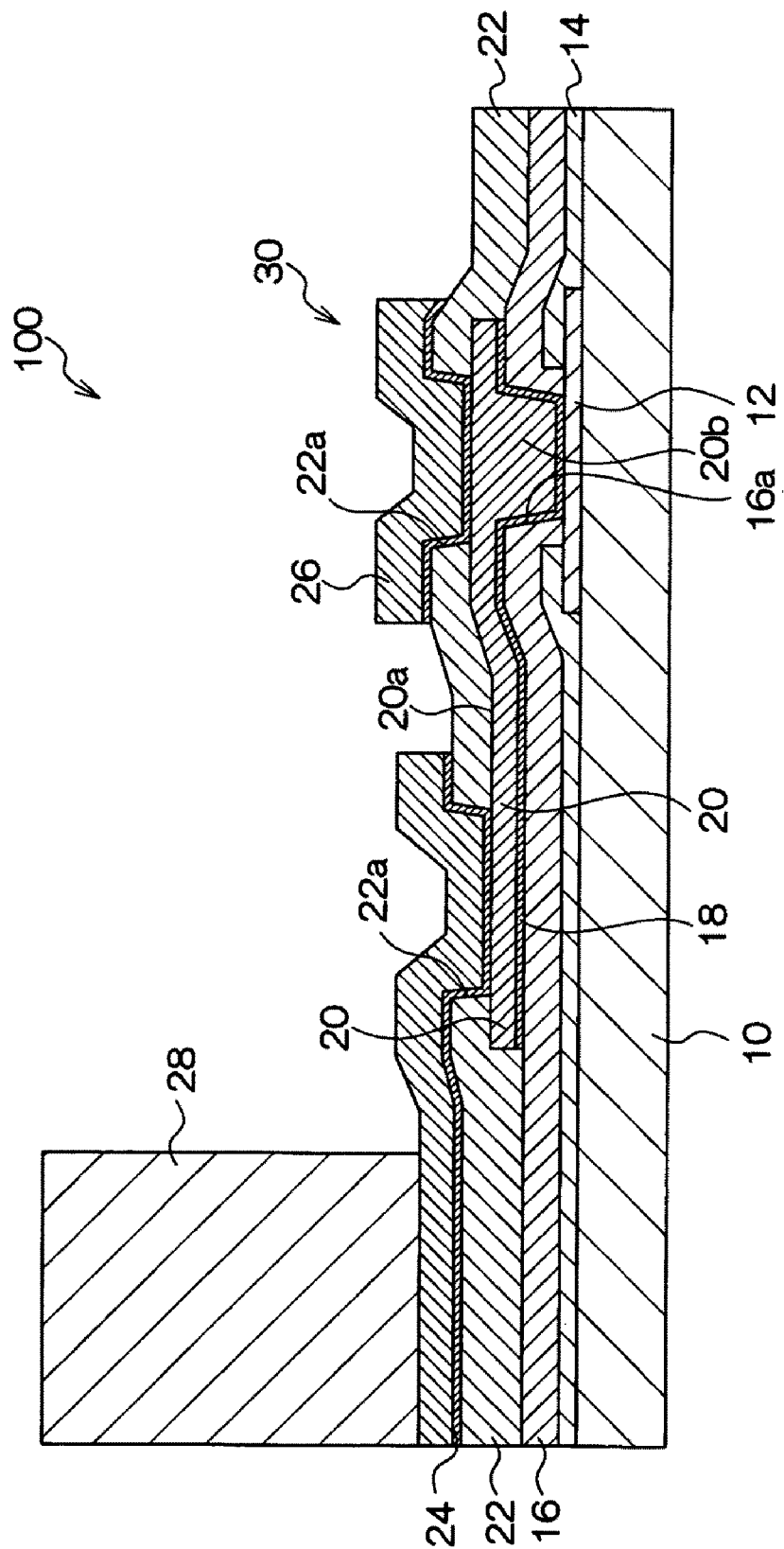
FIG. 1 is a partial cross-section showing an example of a multilayered structure of a semiconductor device according to a first exemplary embodiment of the present invention.

FIG. 1 is a partial cross-section showing an example of a multilayered structure of a semiconductor device according to a first exemplary embodiment of the present invention. A semiconductor device 100 according to the first exemplary embodiment is a WCSP of multilayer redistribution structure, and is equipped with: a semiconductor wafer 10; an electrode pad 12; a passivation film 14; a first insulation layer 16; a first opening 16a; a first under bump metal (UBM) layer 18; a first redistribution layer 20; a first via interconnect 20b; a second insulating layer 22; a second opening 22a; a second UBM layer 24; a second redistribution layer 26; and a post electrode 28.

In the semiconductor device 100, a stacked structure 30 is formed from the via portion of the first redistribution layer 20 and the via portion of the second redistribution layer 26 each superimposed on the electrode pad 12. In the present exemplary embodiment, a "two-stage electroplating method" is applied for the process for forming the first redistribution layer 20. Note that, while not shown in the drawings, the surface of the semiconductor device 100 is covered by a protective film, except for at the end portion of the post electrode 28. An external connection terminal, such as a solder ball or the like, is connected to the post electrode 28, at the end portion that is exposed from the protective film.

Explanation will now be given of the structure of the semiconductor device 100 according to the first exemplary embodiment, following the manufacturing processes thereof. FIG. 2 to FIG. 13 are partial cross-sections representing manufacturing processes of a semiconductor device according to the first exemplary embodiment. A WCSP is a structural body from which CSP's are obtained by dicing into individual semiconductor devices a semiconductor with plural semiconductor devices formed on a semiconductor wafer by wafer processing. In these drawings a partial structure of one electrode pad's worth (one individual semiconductor device) is shown in the drawing and will be explained.

Processes for Forming the First Insulation Layer

Figure 2:
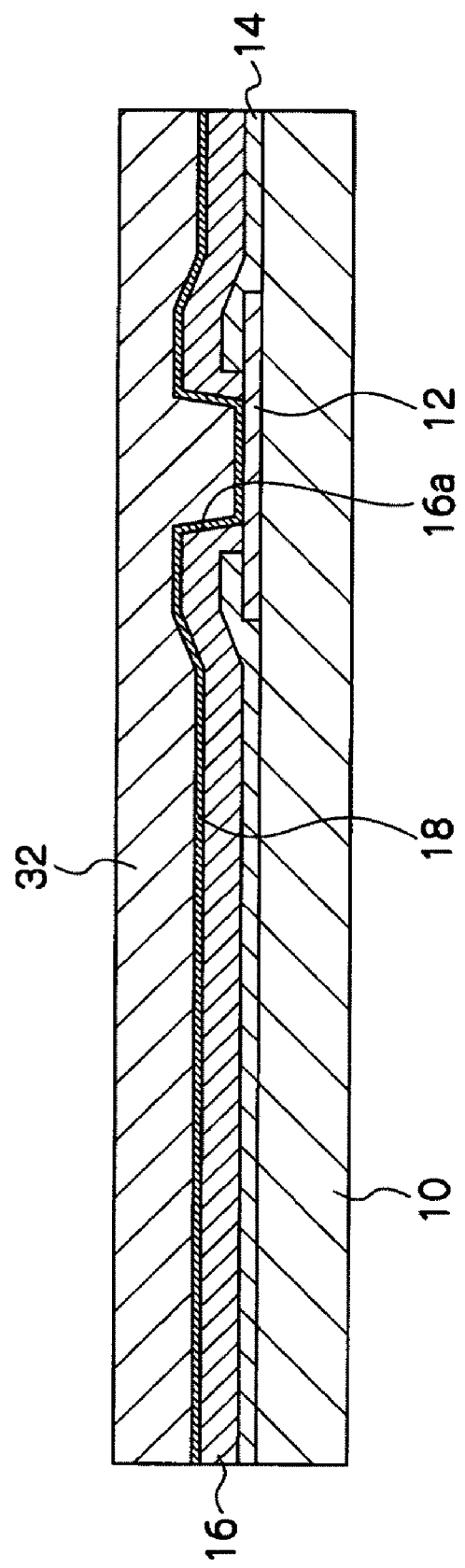
FIG. 2 to FIG. 13 are partial cross-sections representing manufacturing processes of a semiconductor device according to the first exemplary embodiment.

FIG. 2 is a partial cross-section representing a manufacturing process of the first insulation layer 16. First, as shown in FIG. 2, the electrode pad 12 is formed on the surface (main surface side) of the semiconductor wafer 10. Then the passivation film 14 is formed on the semiconductor wafer 10 and the electrode pad 12, so as to expose a portion of the electrode pad 12. Next, the first insulation layer 16 is formed on the face of the semiconductor wafer 10 using a photosensitive resin, such as (poly)benzoxazole (PBO), or the like. The first opening 16a (first via portion), for exposing a portion of the electrode pad 12, is formed by photo-exposing and development processing the first insulation layer 16.

Processes for Forming the First Redistribution Layer

As shown in FIG. 2, after the first insulation layer 16 has been formed, the first UBM layer 18 is formed as a film with substantially uniform thickness on the first insulation layer 16, following the undulations of the surface. A first electrically conductive material for forming the first redistribution layer 20 is contained in the first UBM layer 18. The UBM layer is also referred to as a seed layer, and it is a metal thin film for promoting electroplating growth of the redistribution layer, which is going to be formed as the layer above. For example, in the case of copper lines where the electrically conductive material is Cu, the UBM layer is formed of Ti (titanium) and Cu (copper), sequentially deposited using sputtering.

Figure 3:
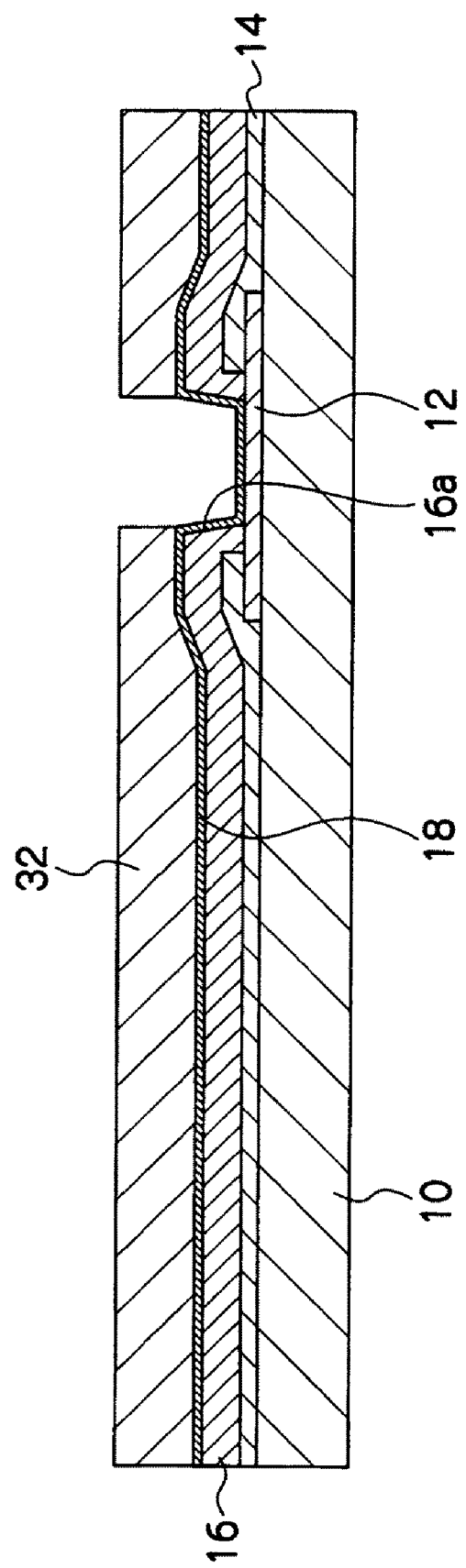

Next, a resist film 32 is formed from a photoresist material on the first UBM layer 18. As shown in FIG. 3, the resist film 32 is patterned by photolithography to give the desired redistribution pattern. Namely, the resist film 32 is removed in the region to be formed with the first via interconnect 20b, exposing the first UBM layer 18 surface.

Figure 4:
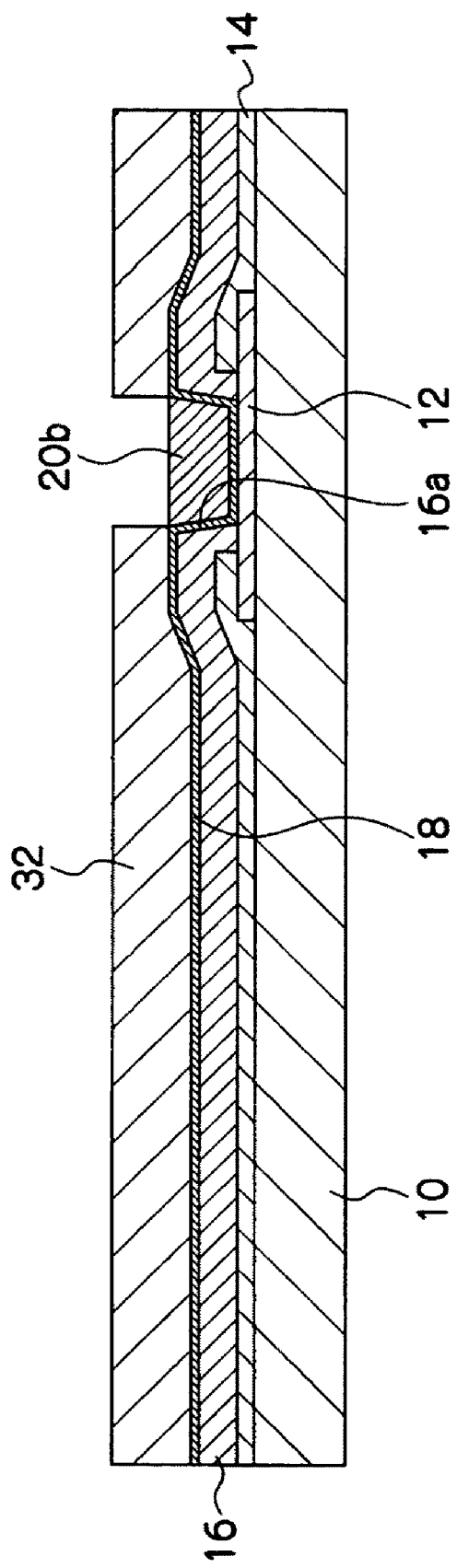

Next, as shown in FIG. 4, the first electrically conductive material is grown using electroplating from the exposed surface of the first UBM layer 18, and the first via interconnect 20b is formed filling the first opening 16a (first via portion). An amount of electroplating liquid sufficient to fill the first via portion is supplied. The surface of the first via interconnect 20b is formed in a position that is just slightly higher than the surface of the first insulation layer 16. For example, when the thickness of the first via interconnect 20b is about 8 micro meters, the time required for preparation by the electroplating method is about 10 minutes.

Figure 5:
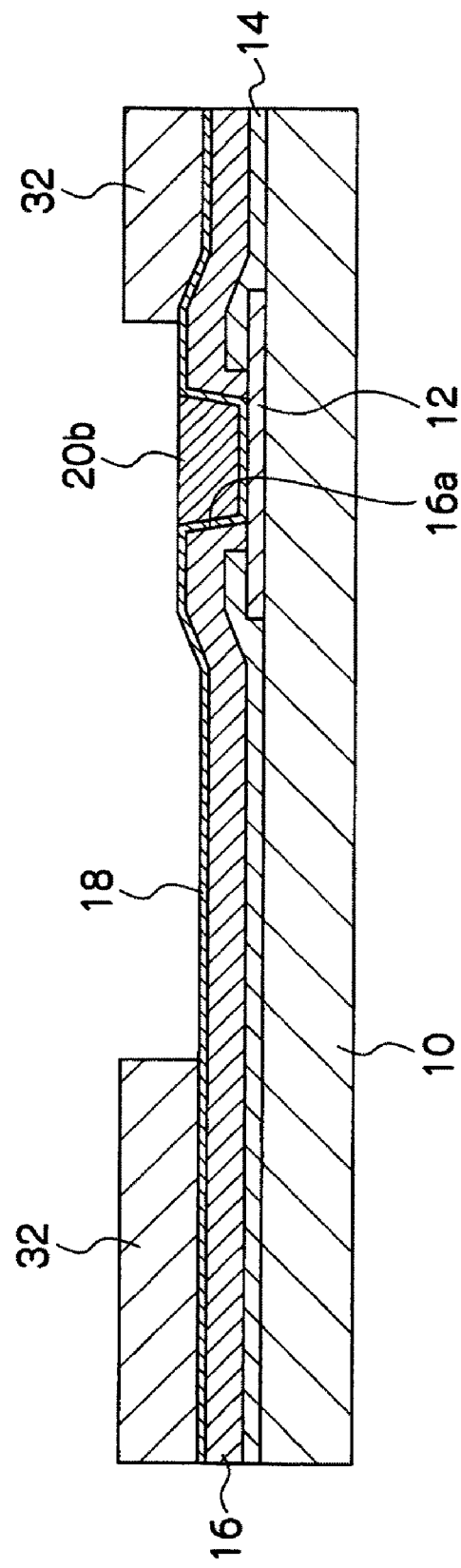
Figure 6:
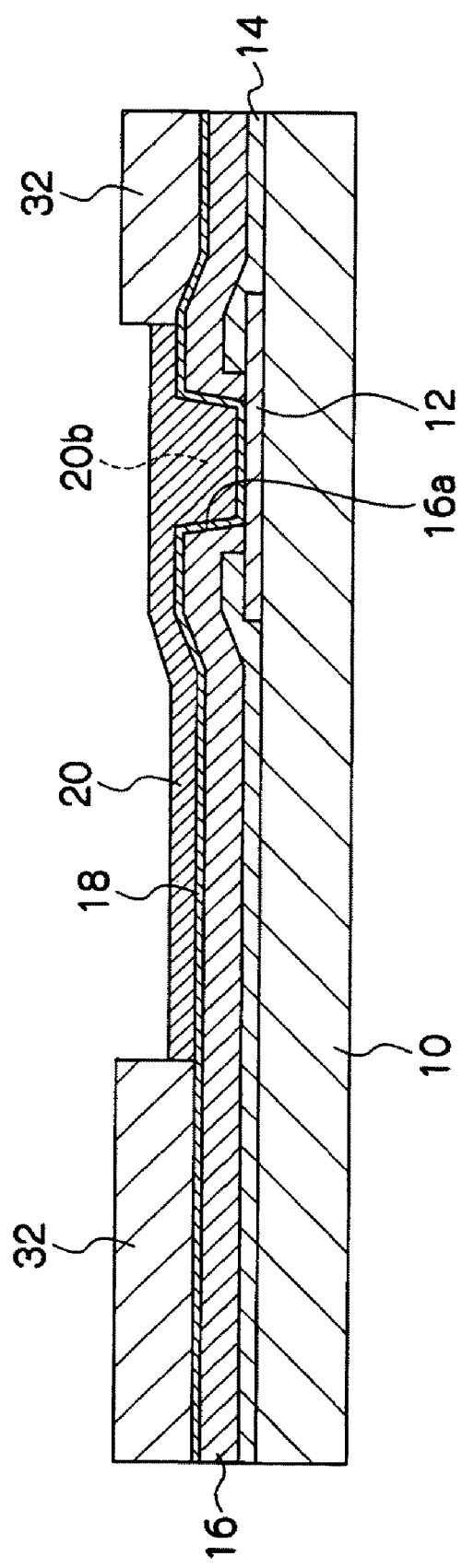

Next, as shown in FIG. 5, the reused resist film 32 is further removed in the region to be formed with the first redistribution layer 20, and the surface of the first UBM layer 18 is newly exposed. Next, as shown in FIG. 6, the first electrically conductive material is grown using electroplating from the exposed surface of the first UBM layer 18, and the first redistribution layer 20 is formed electrically connected to the first via interconnect 20b. For example, the thickness of the first redistribution layer 20 can be made to be about 8 micro meters, similar to that of the first via interconnect 20b.

In the above two-stage electroplating method, the electroplating liquid penetrates into the first opening 16a without any gaps, forming the first via interconnect 20b. Therefore, when the first redistribution layer 20 is being formed the electroplating liquid does not enter the already formed first via interconnect 20b, and film forming defects, "fault-breaks" or the like, do not occur. The first redistribution layer 20 and the first via interconnect 20b are integrated together in this manner, suppressing occurrences of poor electrical connection between the first redistribution layer 20 and the first via interconnect 20b.

Figure 7:
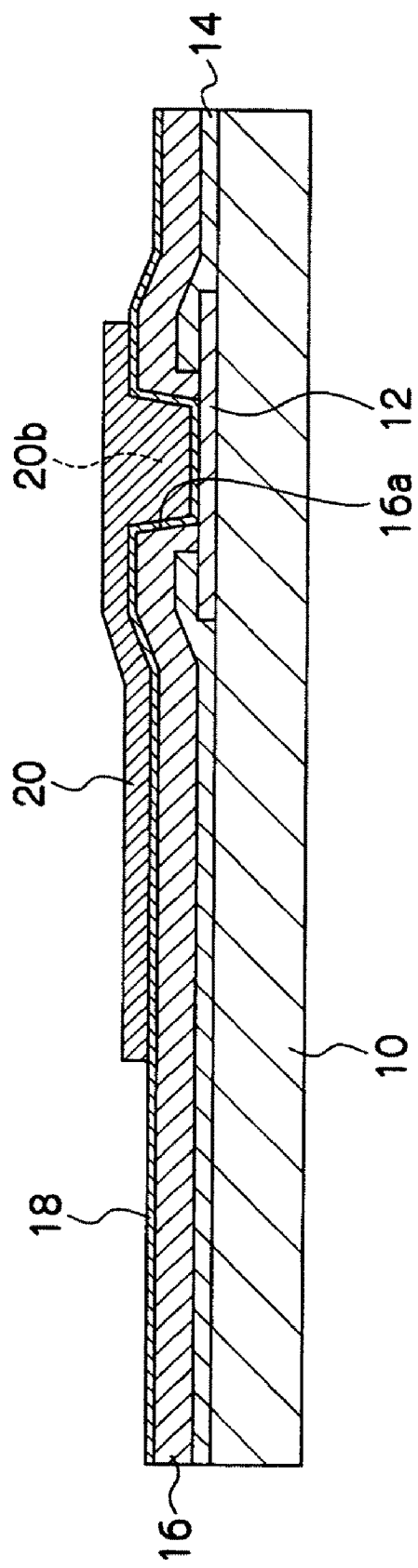
Figure 8:
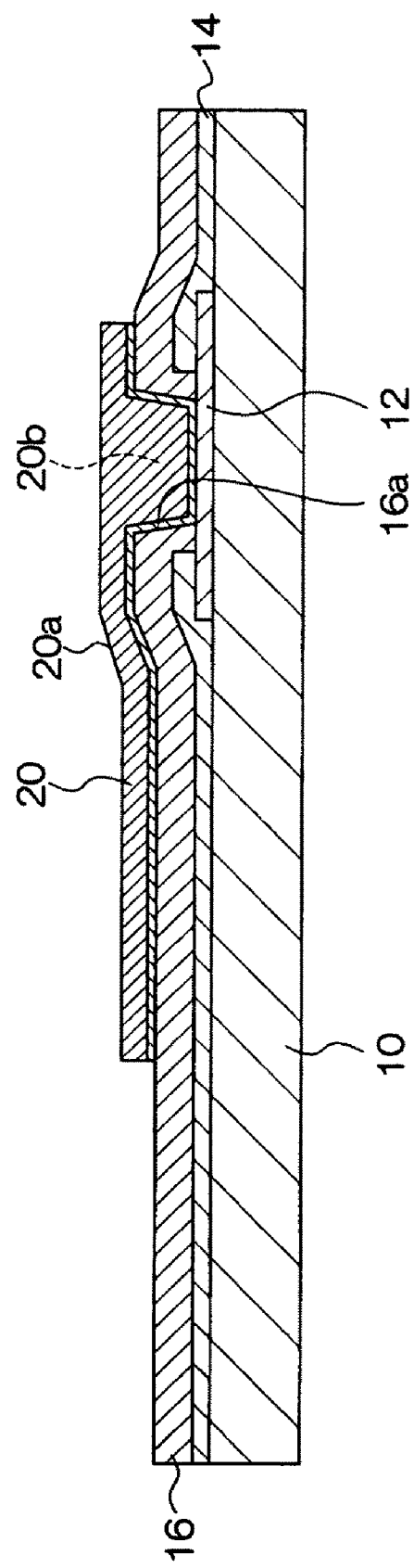

Next, as shown in FIG. 7, the remaining resist film 32 is removed. Subsequently, as shown in FIG. 8, the portion of the first UBM layer 18 where the first redistribution layer 20 is not stacked is removed. For example, when the UBM layer is formed from Ti and Cu, the Cu layer that has not been grown by electroplating is removed by etching, and then the Ti layer is removed by etching. The surface of the first insulation layer 16 is exposed at the portion where the first UBM layer 18 is removed. The first redistribution layer 20 making contact with the electrode pad 12 is thereby completed.

Processes for Forming Second Insulating Layer

Figure 9:
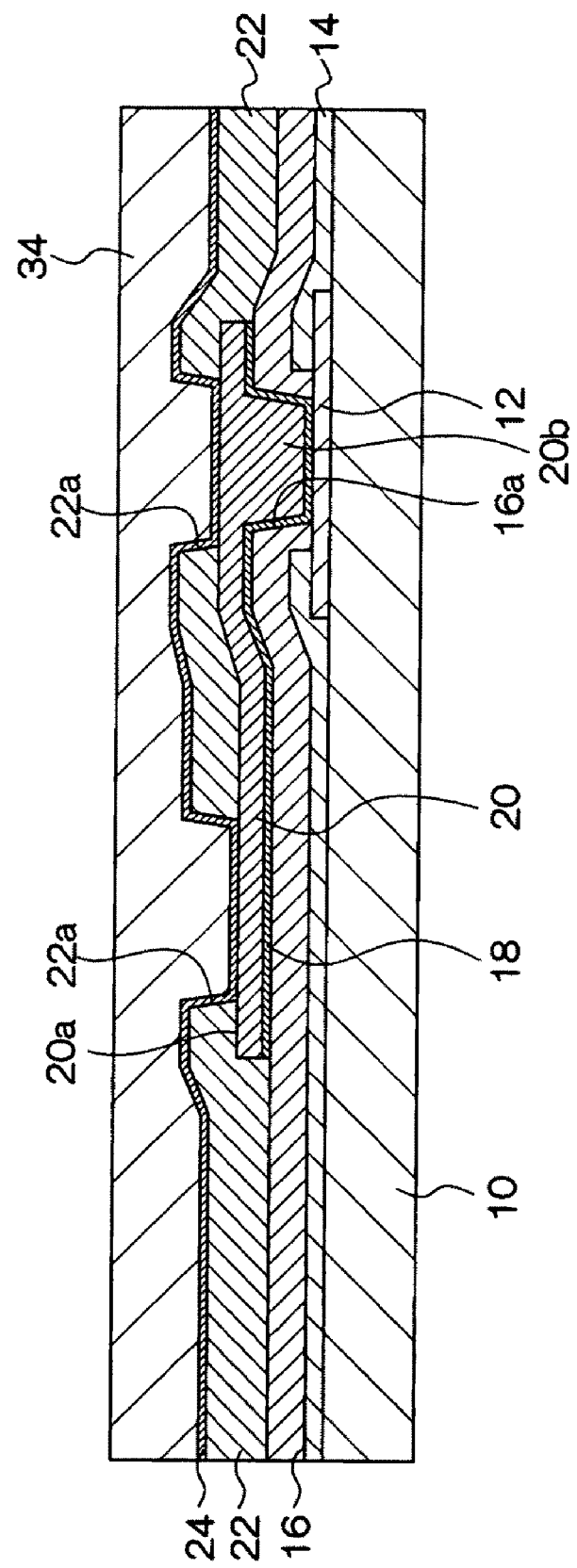

FIG. 9 is a partial cross-section representing a process for forming the second insulating layer 22. As shown in FIG. 9, the second insulating layer 22 is formed from a photosensitive resin, such as PBO or the like, on the main surface of the semiconductor wafer 10 formed with the first redistribution layer 20. At least one of the second openings 22a (two in the example of FIG. 9) is formed by photo-exposing and development processing the second insulating layer 22, such that a portion of the first redistribution layer 20 is exposed. The size of the second opening 22a formed above the first via interconnect 20b is larger than the size of the first opening 16a, and the second insulating layer 22 is removed at a portion facing the first opening 16a (the first via interconnect 20b).

Processes for Forming the Second Redistribution Layer

Figure 10:
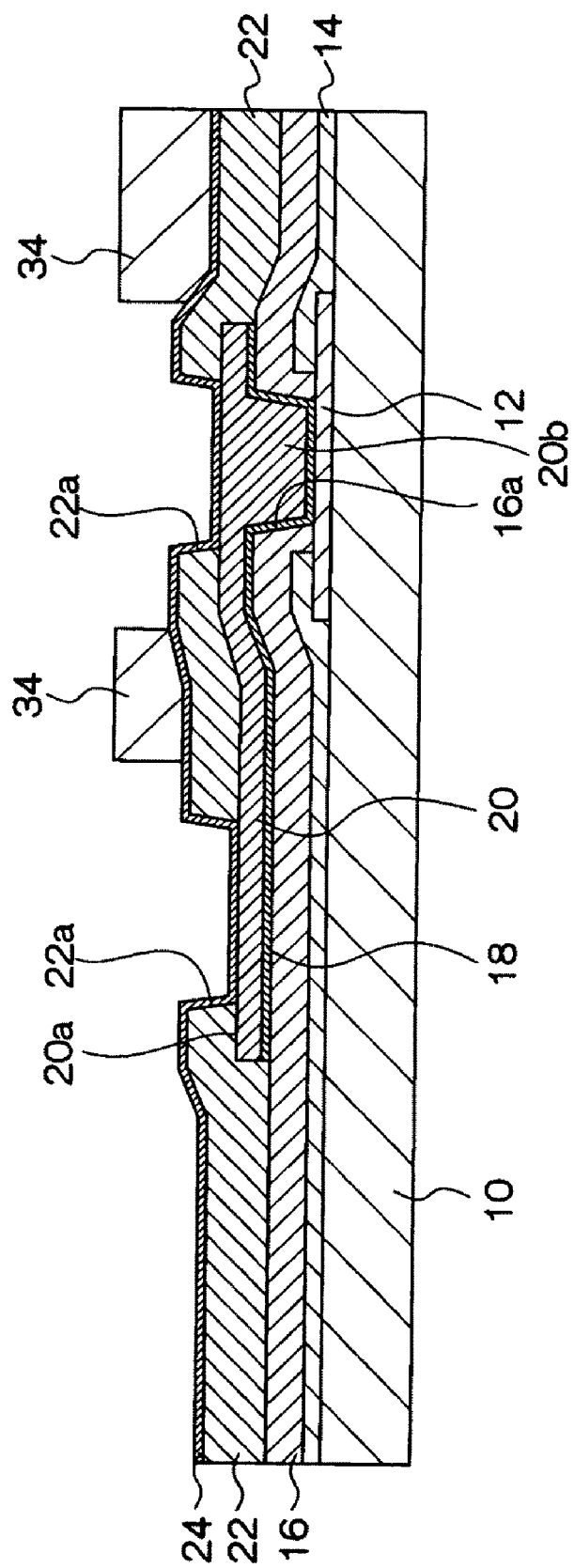

After forming the second insulating layer 22, the second UBM layer 24 is formed as a thin film of substantially uniform thickness on the second insulating layer 22, following the undulations of the surface. A second electrically conductive material for forming the second redistribution layer 26 is contained in the second UBM layer 24. In a case of copper lines, the UBM layer is formed from Ti and Cu. Next, a resist film 34 is formed from a photoresist material on the second UBM layer 24. As shown in FIG. 10, the resist film 34 is patterned with the desired redistribution pattern by photolithography. Namely, the resist film 34 is removed in the region where the second redistribution layer 26 is to be formed, exposing the surface of the second UBM layer 24.

Figure 11:
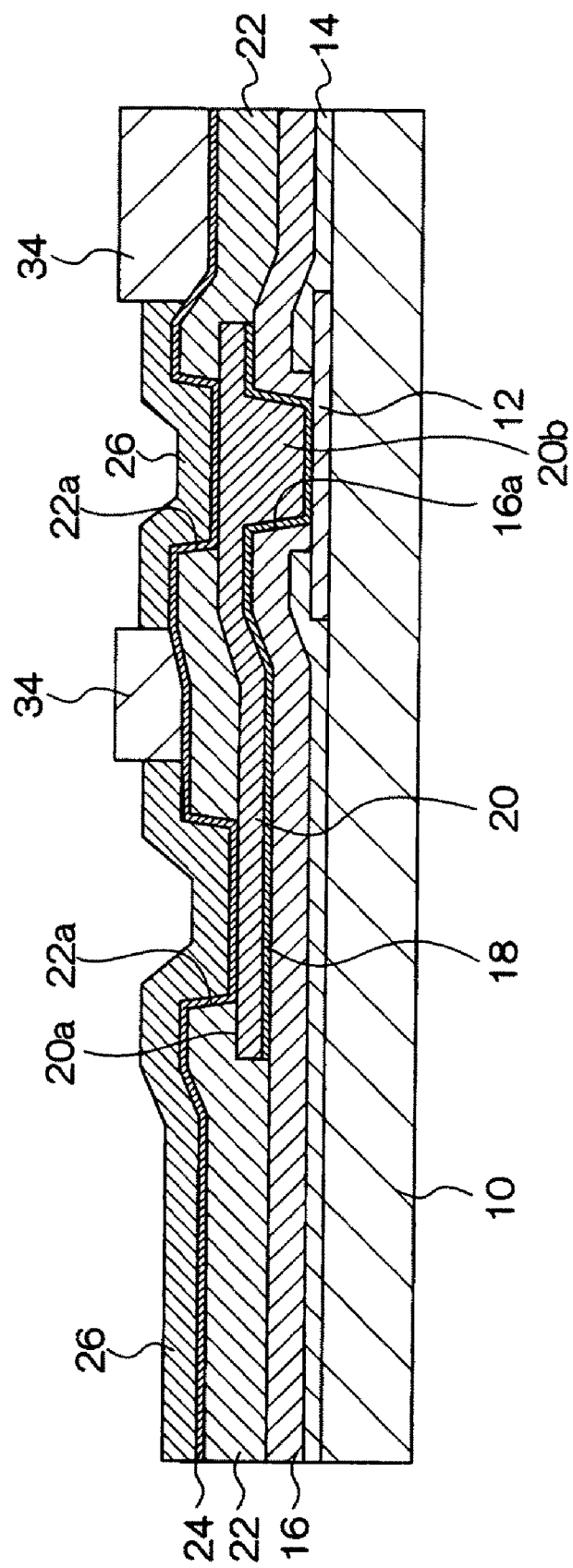
Figure 12:
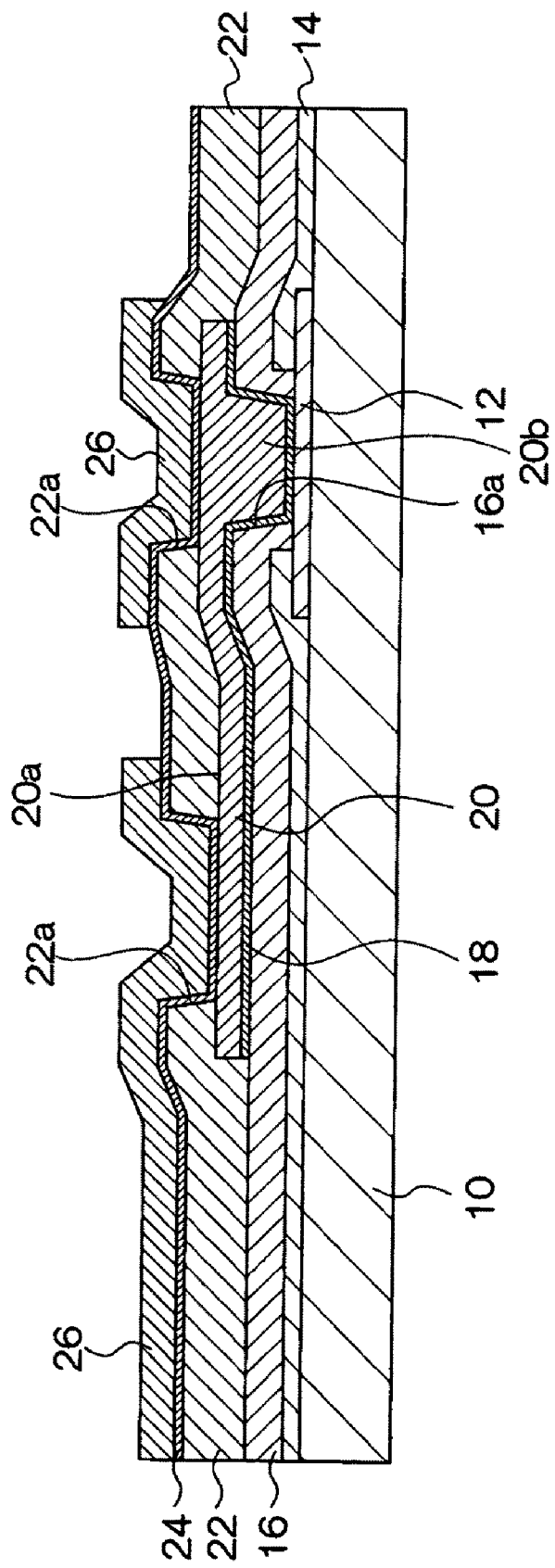

Next, as shown in FIG. 11, the second redistribution layer 26 is formed by growing the second electrically conductive material from the exposed surface of the second UBM layer 24 using electroplating. Next, as shown in FIG. 12, the remaining resist film 34 is removed. The second redistribution layer 26 making contact with the first redistribution layer 20 is thereby completed. The second redistribution layer 26 is formed of substantially uniform thickness following the undulations of the surface, to give a structure that dips inward at the portion where the second opening 22a is formed. In the present exemplary embodiment, this portion corresponds to the via portion of the second redistribution layer 26.

The via portion of the second redistribution layer 26 is superimposed on the via portion (first via interconnect 20b) of the first redistribution layer 20, configuring the stacked structure 30. The surface 20a of the first redistribution layer 20 is flat. The electrical contact between the second redistribution layer 26 and the via portion of the first redistribution layer 20 is thereby improved in comparison to cases where there are undulations on the surface 20a of the first redistribution layer 20.

Processes for Forming the Post Electrode

Figure 13:
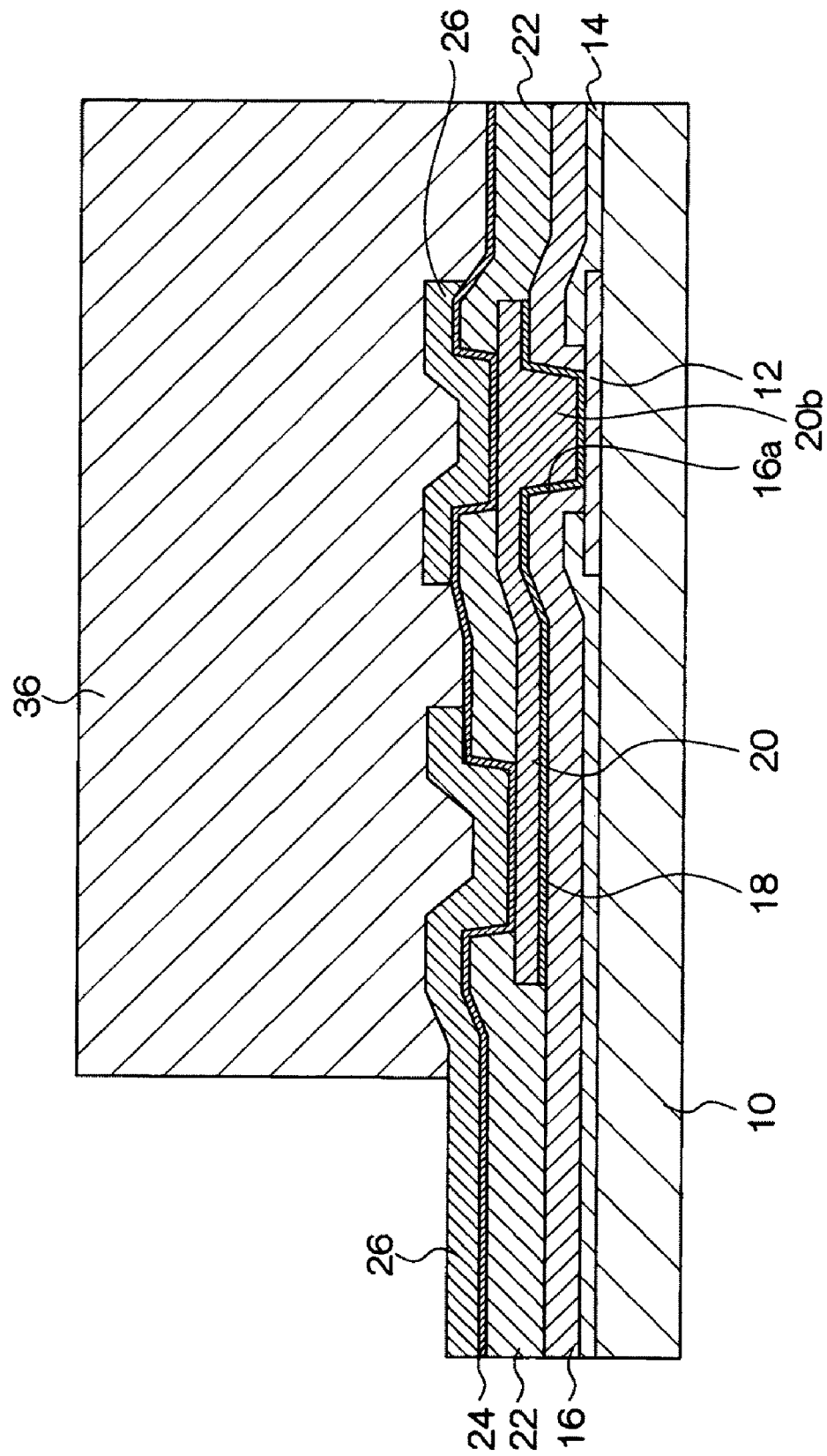

Next, as shown in FIG. 13, a dry film resist DF 36 is stuck on the main surface of the semiconductor wafer 10 formed with the second redistribution layer 26. The dry film resist DF 36 is patterned with the desired pattern using photolithography. Namely, the dry film resist DF 36 is removed from the region where the post electrode 28 is to be formed, exposing the surface of the second redistribution layer 26. As shown in FIG. 1, next the post electrode 28 is formed by growing the second electrically conductive material from the exposed surface of the second redistribution layer 26 using electroplating.

Finally, the remaining resist film 36 is removed, then the second UBM layer 24 is removed at the portion where the second redistribution layer 26 is not stacked. As described above, when the UBM layer is made from Ti and Cu, for example, the Cu layer is removed by etching, and then the Ti layer is removed by etching. The surface of the second insulating layer 22 is exposed at portions where the second UBM layer 24 is removed. Thereby, the semiconductor device 100 according to the first exemplary embodiment is completed.

Note that the processes set out below are additionally performed when the surface of the semiconductor device 100 is covered with a protective film and the end portion of the post electrode 28 is connected to an external connection terminal. Namely, after forming the post electrode 28, the main surface of the semiconductor wafer 10, on which the post electrode 28 has been formed, is covered with a protective film, using a resin mold or the like. Then, the protective film is machined, exposing the surface of the post electrode 28. An external connection terminal, such as a solder ball or the like, is connected to the surface of the post electrode 28, and a WCSP of multilayer redistribution structure is obtained. Furthermore, in the case of a multilayer structure having further redistribution layer(s), the post electrode 28 is formed after such multilayer redistribution layers have been formed in sequence, in a similar manner to forming either the first redistribution layer 20 or the second redistribution layer 26.

As explained above, in the first exemplary embodiment, by use of the above two-stage electroplating method, the electroplating liquid penetrates into the first opening 16a without any gaps, forming the first via interconnect 20b. Therefore, when the first redistribution layer 20 is being formed the electroplating liquid does not enter the already formed first via interconnect 20b, and film forming defects, "fault-breaks" or the like, do not occur. Thereby occurrences of poor electrical connection between the first redistribution layer 20 and the first via interconnect 20b are suppressed.

Furthermore, the surface 20a of the first redistribution layer 20 is flat. The electrical contact between the via portion of the first redistribution layer 20 and the second redistribution layer 26 is thereby improved at the stacked structure 30, in comparison to cases where there are undulations on the surface 20a of the first redistribution layer 20.

Second Exemplary Embodiment

Figure 14:
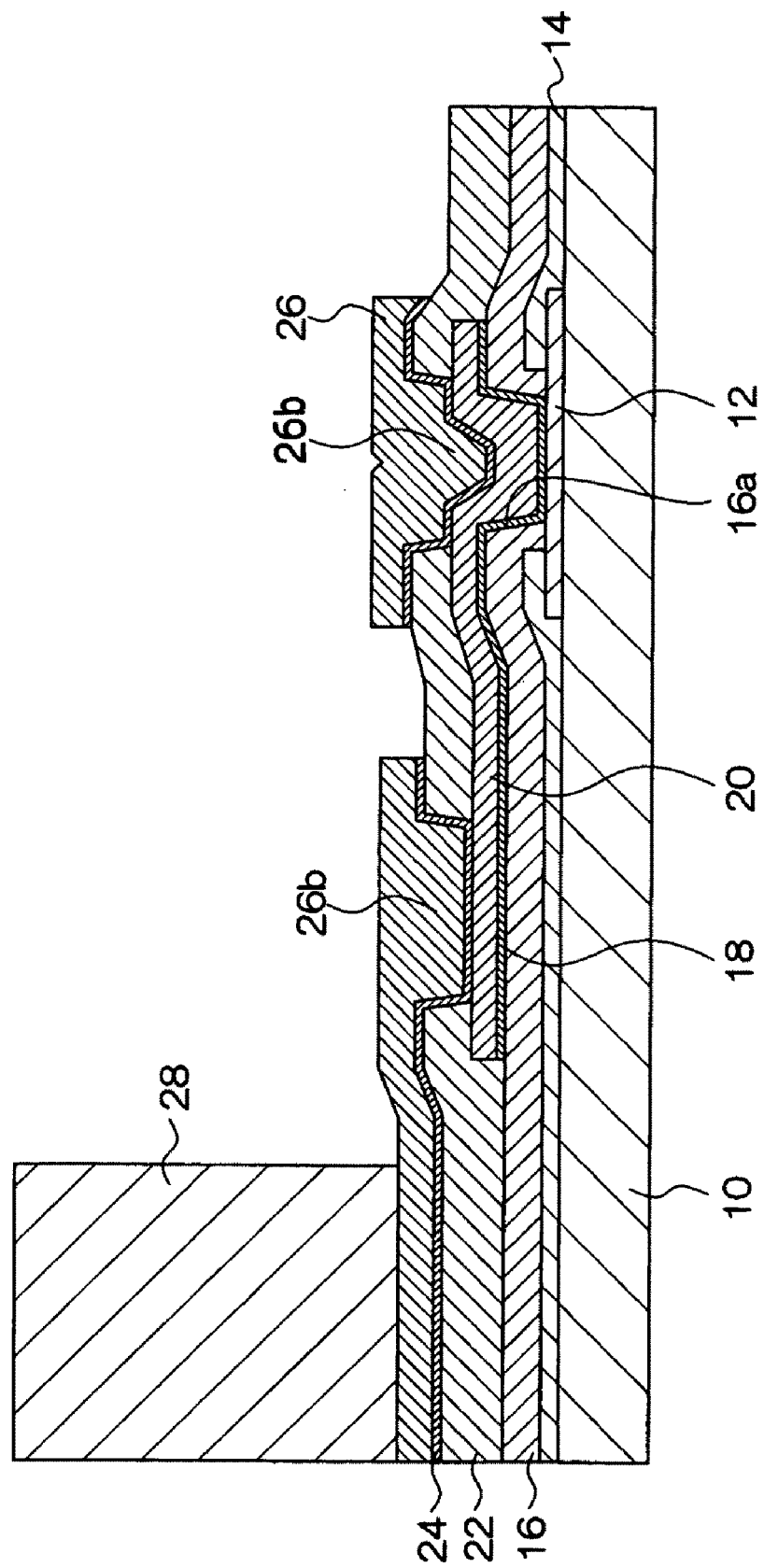
FIG. 14 is a partial cross-section showing an example of a multilayered structure of a semiconductor device according to a second exemplary embodiment of the present invention.

FIG. 14 is a partial cross-section showing an example of a multilayered structure of a semiconductor device according to a second exemplary embodiment of the present invention. A semiconductor device 102 according to the second exemplary embodiment is substantially the same as the semiconductor device 100 according to the first exemplary embodiment (see FIG. 1), and is equipped with: a semiconductor wafer 10; an electrode pad 12; a passivation film 14; a first insulation layer 16; a first opening 16a; a first UBM layer 18; a first redistribution layer 20; a second insulating layer 22; a second opening 22a; a second UBM layer 24; a second redistribution layer 26; a second via interconnect 26b; and a post electrode 28.

In the semiconductor device 102, the via portions of the first redistribution layer 20 and the second redistribution layer 26 are respectively superimposed on the electrode pad 12, configuring a stacked structure 30. In the present exemplary embodiment, a "two-stage electroplating method" is applied for the forming process of the second redistribution layer 26. Note that portions similar to those of the semiconductor device 100 according to the first exemplary embodiment are allocated the same reference numerals and explanation thereof is abbreviated.

Explanation will now be given of the structure of the semiconductor device 102 according to the second exemplary embodiment, following the manufacturing processes thereof. FIG. 15 to FIG. 23 are partial cross-sections representing manufacturing processes of a semiconductor device according to the second exemplary embodiment. A partial structure of one electrode pad's worth (one individual semiconductor device) is shown in each of the respective drawings.

Processes for Forming the First Insulation Layer

The processes for forming the first insulation layer 16 (see FIG. 2) are similar to those of the semiconductor device 100 according to the first exemplary embodiment, the same reference numerals are allocated and explanation is omitted.

Processes for Forming the First Redistribution Layer

Figure 15:
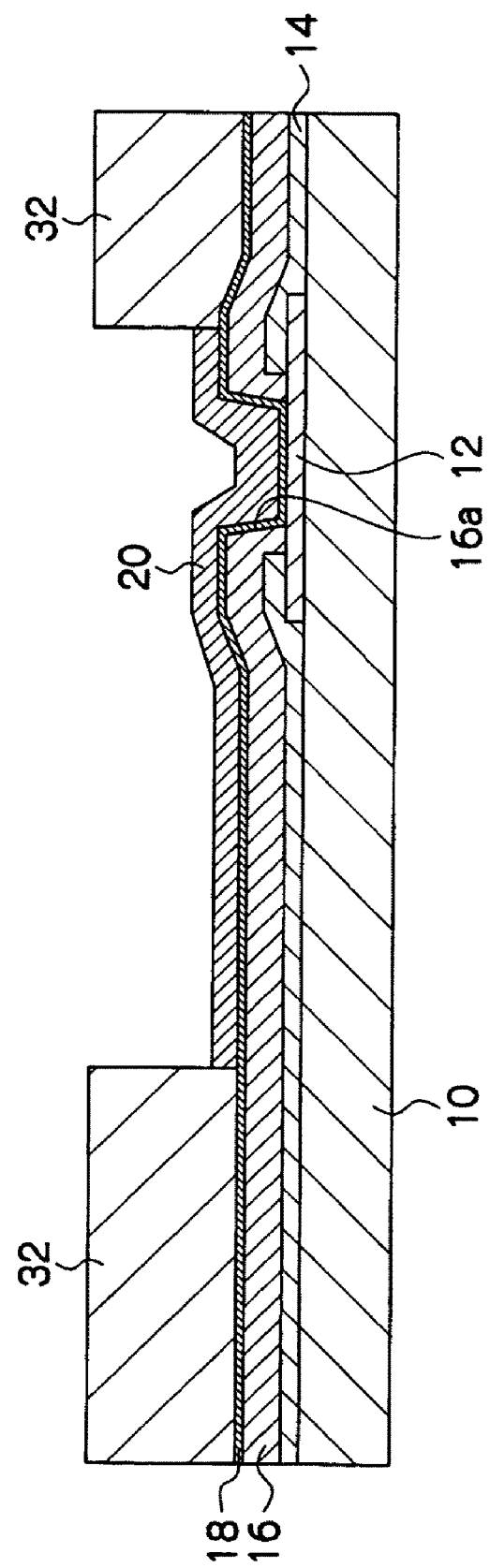
FIG. 15 to FIG. 23 are partial cross-sections representing manufacturing processes of a semiconductor device according to the second exemplary embodiment.

As shown in FIG. 15, the first UBM layer 18 is formed as a film with substantially uniform thickness on the first insulation layer 16, following the undulations of the surface. A resist film 32, patterned by photolithography to give the desired redistribution pattern, is formed on the first UBM layer 18. The resist film 32 is removed in the region to be formed with the first redistribution layer 20, and the surface of the first UBM layer 18 exposed. A first electrically conductive material is grown from the exposed surface of the first UBM layer 18 using electroplating, and the first redistribution layer 20 is formed.

Figure 16:
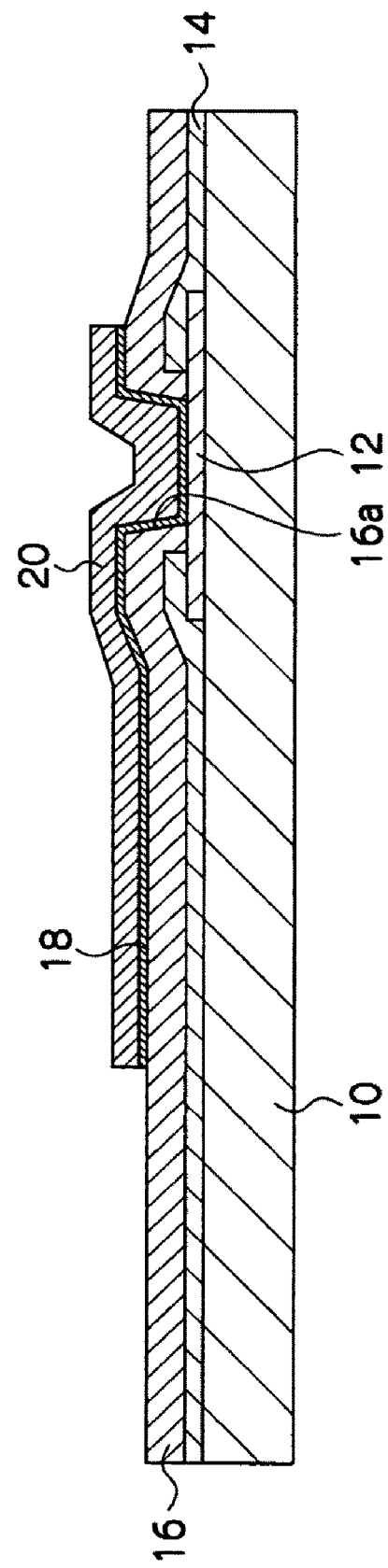

Next, as shown in FIG. 16, the remaining resist film 32 is removed, and then the UBM layer 18 is removed from the region where the first redistribution layer 20 is not stacked. The surface of the first insulation layer 16 is exposed at the portion where the first UBM layer 18 is removed. The first redistribution layer 20 making contact with the electrode pad 12 is thereby completed. The first redistribution layer 20 is formed at a substantially uniform thickness, flowing the contours of the surface, to give a structure that dips inwards at the portion where the first opening 16a is formed. In the present exemplary embodiment, this portion corresponds to the via portion of the first redistribution layer 20.

Processes for Forming the Second Insulating Layer

Figure 17:
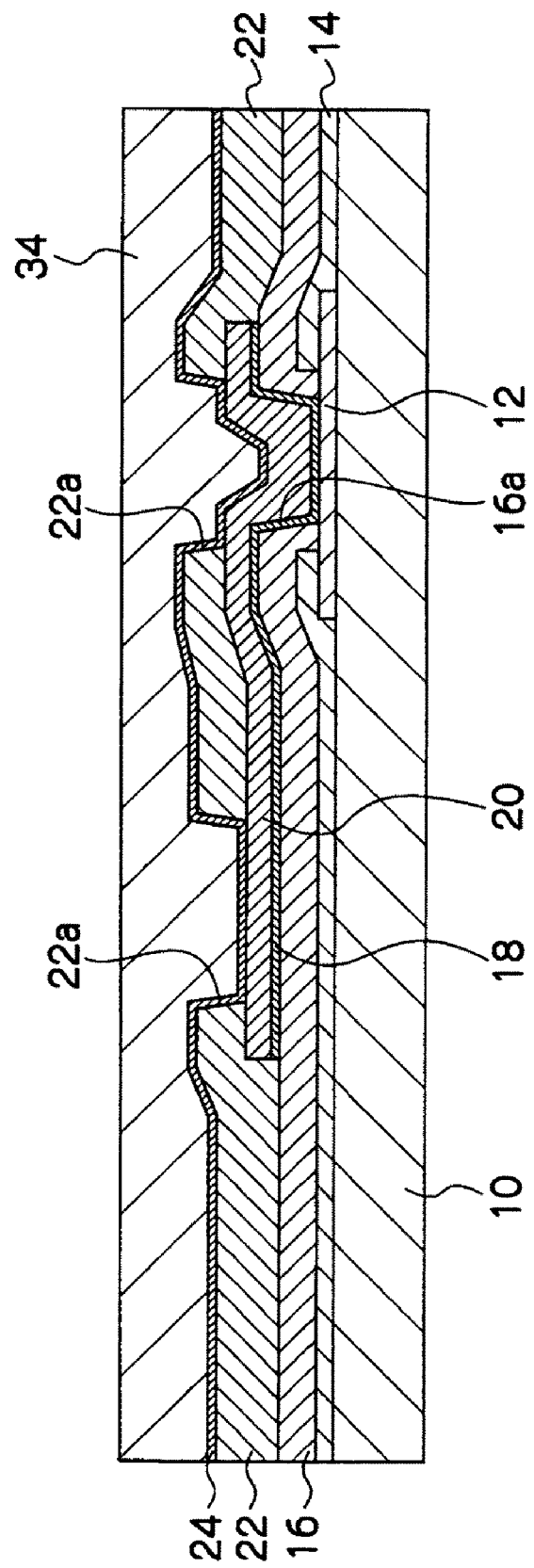

As shown in FIG. 17, the second insulating layer 22 is formed from a photosensitive resin, such as PBO or the like, on the main surface of the semiconductor wafer 10 formed with the first redistribution layer 20. The second openings 22a are formed by photo-exposing and development processing the second insulating layer 22 in order to expose portions of the first redistribution layer 20. The size of the second openings 22a is larger than the size of the first opening 16a, and the second insulating layer 22 is removed at the portion facing the first opening 16a.

Processes for Forming the Second Redistribution Layer

Figure 18:
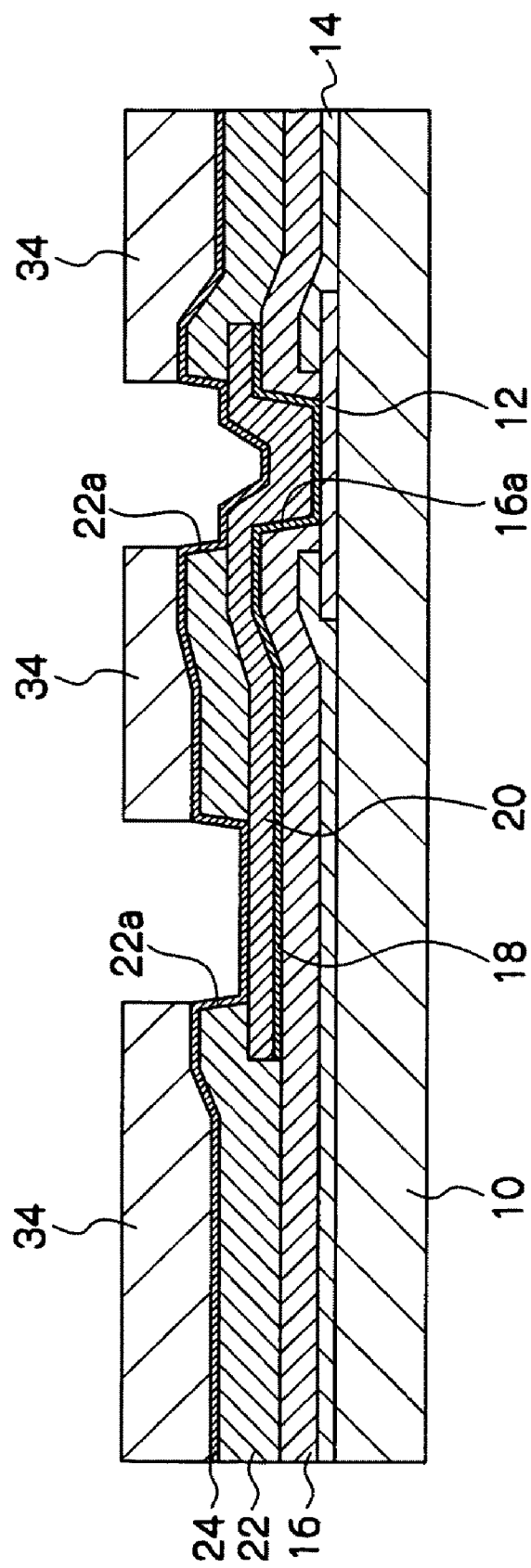

After forming the second insulating layer 22, the second UBM layer 24 is formed as a thin film on the second insulating layer 22. The second UBM layer 24 is formed of substantially uniform thickness following the undulations of the surface, to give a structure that dips inwards at the via portion of the first redistribution layer 20. Next, a resist film 34 is formed from a photoresist material on the second UBM layer 24. As shown in FIG. 18, the resist film 34 is patterned with the desired redistribution pattern by photolithography. Namely, the resist film 34 is removed in the regions where second via interconnects 26b of the second redistribution layer 26 are to be formed, exposing the surface of the second UBM layer 24.

Figure 19:
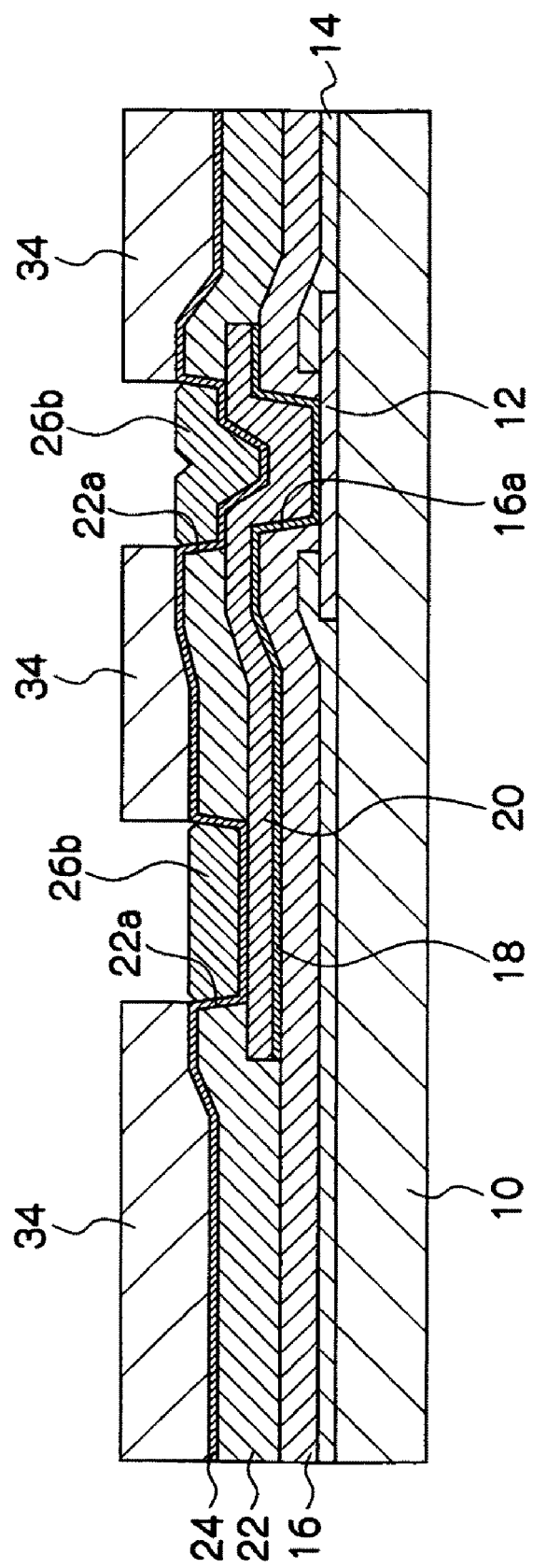

Next, as shown in FIG. 19, the second electrically conductive material is grown from the exposed surface of the second UBM layer 24 using electroplating, and the second via interconnects 26b are formed filling within the second openings 22a (second via portions). The electroplating liquid is supplied in a sufficient amount so as to fill the second via portion that dips at the center. The surface of the second via interconnects 26b is formed up to a position that is just slightly higher than the surface of the second insulating layer 22. For example, when the thickness of the second via interconnects 26b is about 8 micro meters, the time required for preparation is about 10 minutes. Sometimes undulations form on the surface of the second via interconnect 26b, following undulations in the surface of the first redistribution layer 20.

Figure 20:
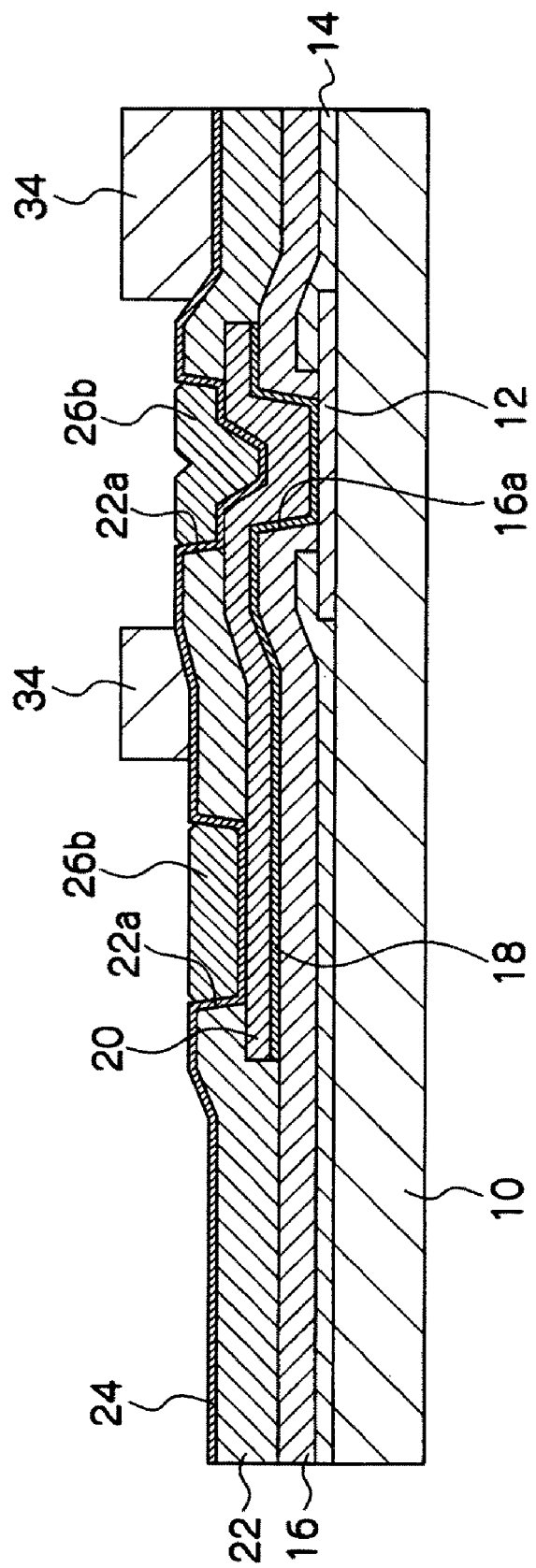
Figure 21:
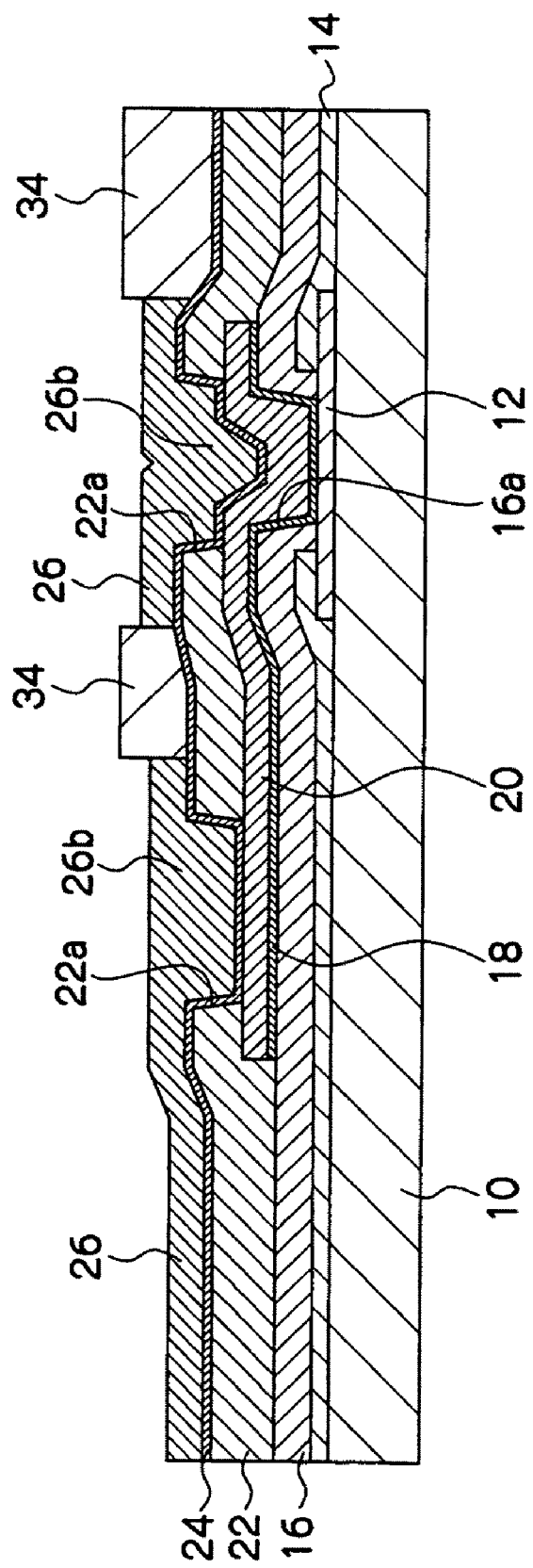

Next, as shown in FIG. 20, the reused resist film 34 is further removed from the region where the second redistribution layer 26 is to be formed, to newly expose the surface of the second UBM layer 24. Next, as shown in FIG. 21, the second electrically conductive material is grown from the exposed surface on the second UBM layer 24 using electroplating, forming the second redistribution layer 26 that is electrical connected to the second via interconnects 26b. For example, the thickness of the second redistribution layer 26 can be about 8 micro meters, similar to that of the second via interconnects 26b.

In the two-stage electroplating method described above, the electroplating liquid penetrates the second opening 22a that dips in the center without any gaps, and the second via interconnect 26b is formed. Therefore, when the second redistribution layer 26 is being formed the electroplating liquid does not enter the already formed second via interconnects 26b, and film forming defects, "fault-breaks" or the like, do not occur. The second redistribution layer 26 and the second via interconnect 26b are integrated together thereby, and occurrences of poor electrical connection between the second redistribution layer 26 and the second via interconnects 26b, and between the first via interconnect 20b and the second via interconnect 26b, are suppressed.

Figure 22:
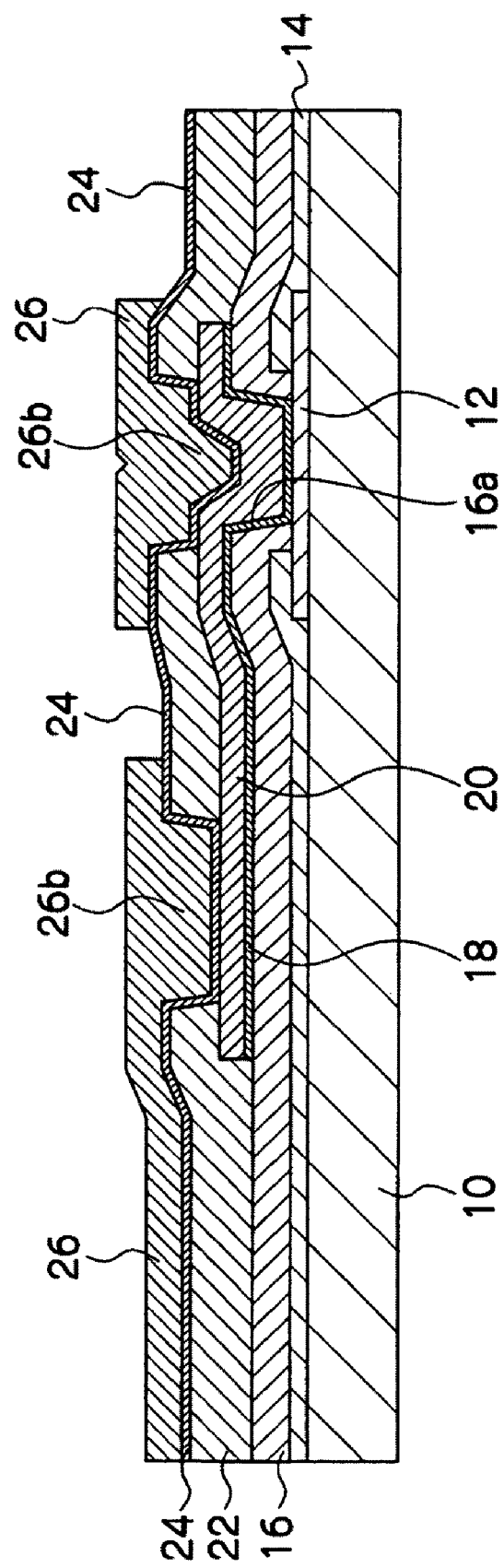

Next, as shown in FIG. 22, the remaining resist film 34 is removed. The second redistribution layer 26 making contact with the first redistribution layer 20 is thereby completed. Due to the two-stage electroplating method described above, the portion corresponding to the second opening 22a of the second redistribution layer 26 is thicker than other portions of the second redistribution layer 26. In particular, the portion corresponding to the via portion of the first redistribution layer 20 is thicker than other portions of the second redistribution layer 26. In the present exemplary embodiment this second via interconnect 26b is superimposed on the via portion of the first redistribution layer 20, configuring the stacked structure 30.

Processes for Forming the Post Electrode

Figure 23:
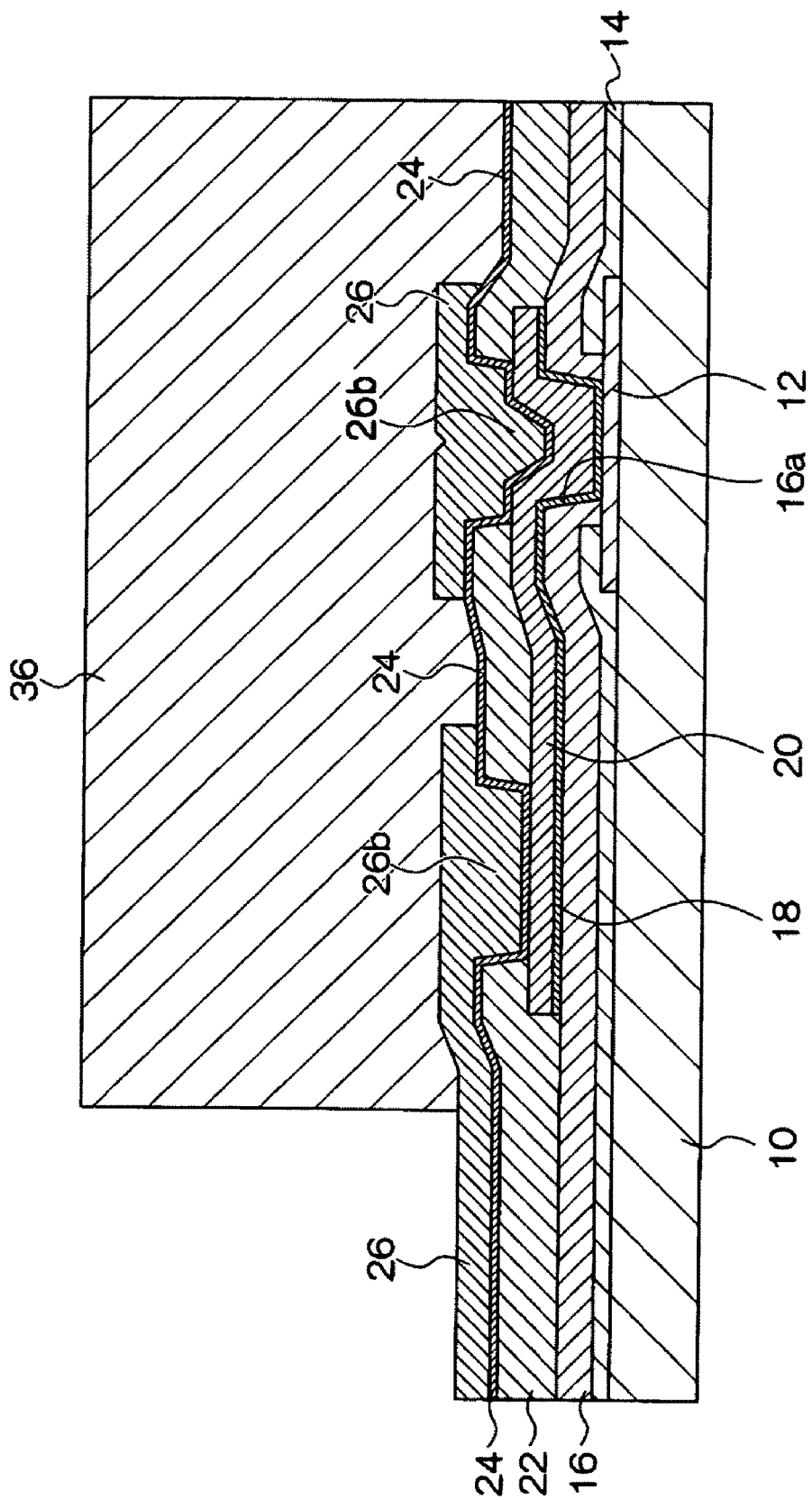

Next, as shown in FIG. 23, a dry film resist DF 36 is stuck on the main surface of the semiconductor wafer 10 formed with the second redistribution layer 26. The dry film resist DF 36 is patterned with the desired pattern using photolithography. Namely, the dry film resist DF 36 is removed from the region where the post electrode 28 is to be formed, exposing the surface of the second redistribution layer 26. As shown in FIG. 14, next the second electrically conductive material is grown from the exposed surface of the second redistribution layer 26 using electroplating, and the post electrode 28 is formed.

Finally, the remaining resist film 36 is removed, then the second UBM layer 24 is removed at the portions where the second redistribution layer 26 is not stacked. The surface of the second insulating layer 22 is exposed at portions where the second UBM layer 24 is removed. Thereby, the semiconductor device 102 according to the second exemplary embodiment is completed.

As explained above, in the second exemplary embodiment, due to the above two-stage electroplating method, the electroplating liquid penetrates into the second opening 22a that dips at the center, without any gaps, forming the second via interconnect 26b. Therefore, when the second redistribution layer 26 is being formed the electroplating liquid does not enter the already formed second via interconnects 26b, and film forming defects, "fault-breaks" or the like, do not occur. Thereby occurrences of poor electrical connection between the second redistribution layer 26 and the second via interconnects 26b, and between the first via interconnects 20b and the second via interconnects 26b, are suppressed.

Furthermore, the surface of the second redistribution layer 26 is made flat, and as well as further improving the electrical contact with redistribution layer above and the via portions thereof, variation in thickness of the redistribution layers overall is reduced.

Third Exemplary Embodiment

Figure 24:
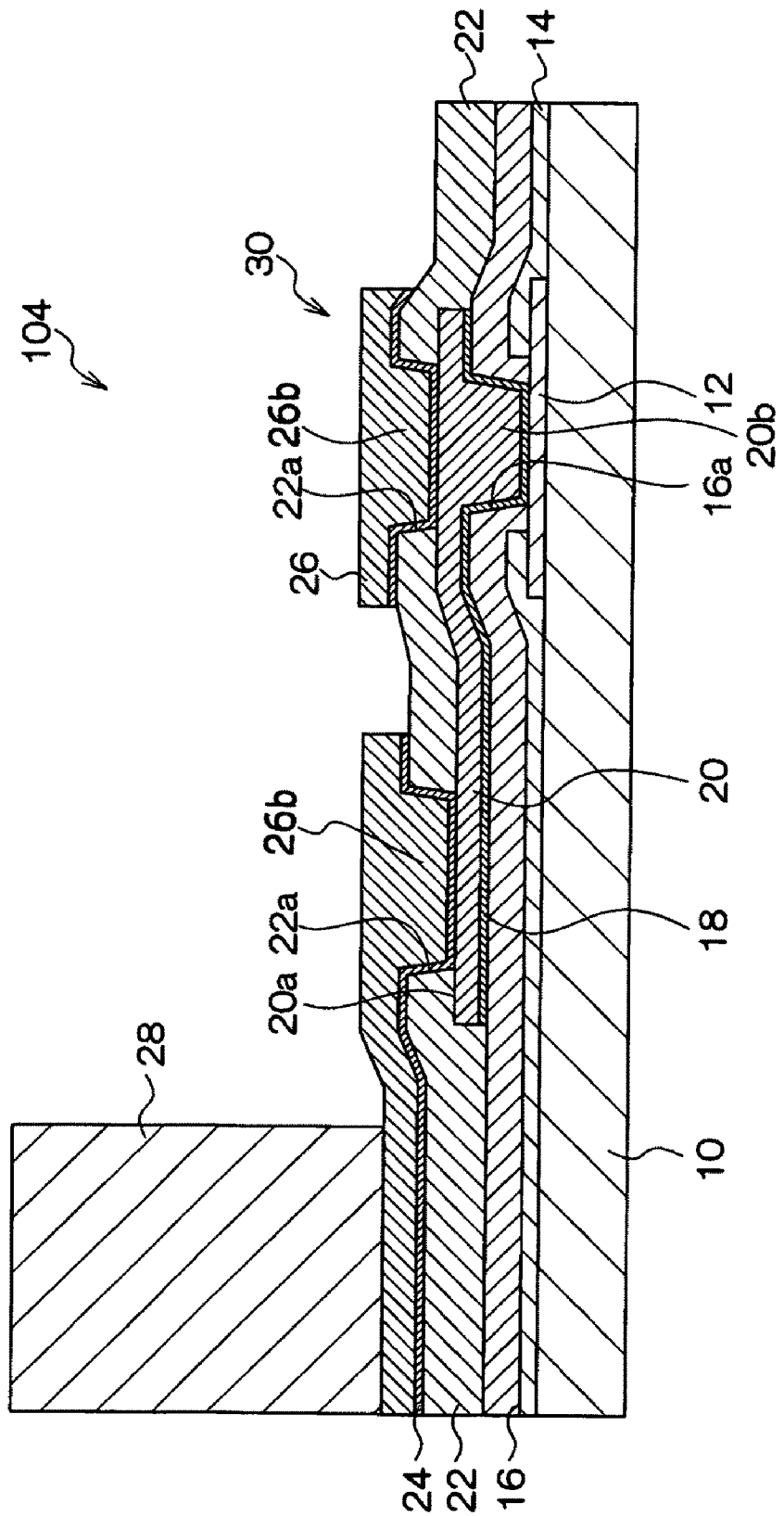
FIG. 24 is a partial cross-section showing an example of a multilayered structure of a semiconductor device according to a third exemplary embodiment of the present invention.

FIG. 24 is a partial cross-section showing an example of a multilayered structure of a semiconductor device according to a third exemplary embodiment of the present invention. A semiconductor device 104 according to the third exemplary embodiment is substantially the same as the semiconductor device 100 according to the first exemplary embodiment (see FIG. 1), and is equipped with: a semiconductor wafer 10; an electrode pad 12; a passivation film 14; a first insulation layer 16; a first opening 16a; a first UBM layer 18; a first redistribution layer 20; a first via interconnect 20b; a second insulating layer 22; second openings 22a; a second UBM layer 24; a second redistribution layer 26; second via interconnects 26b; and a post electrode 28.

In the semiconductor device 104, the via portions of the first redistribution layer 20 and the second redistribution layer 26 are respectively superimposed on the electrode pad 12, forming a stacked structure 30. In the present exemplary embodiment, a "two-stage electroplating method" is applied for the forming processes of the first redistribution layer 20, similar to in the first exemplary embodiment, and a "two-stage electroplating method" is applied for the forming processes of the second redistribution layer 26 similar to in the second exemplary embodiment. Note that portions similar to those of the semiconductor device 100 according to the first exemplary embodiment are allocated the same reference numerals and explanation thereof is abbreviated.

Figure 25:
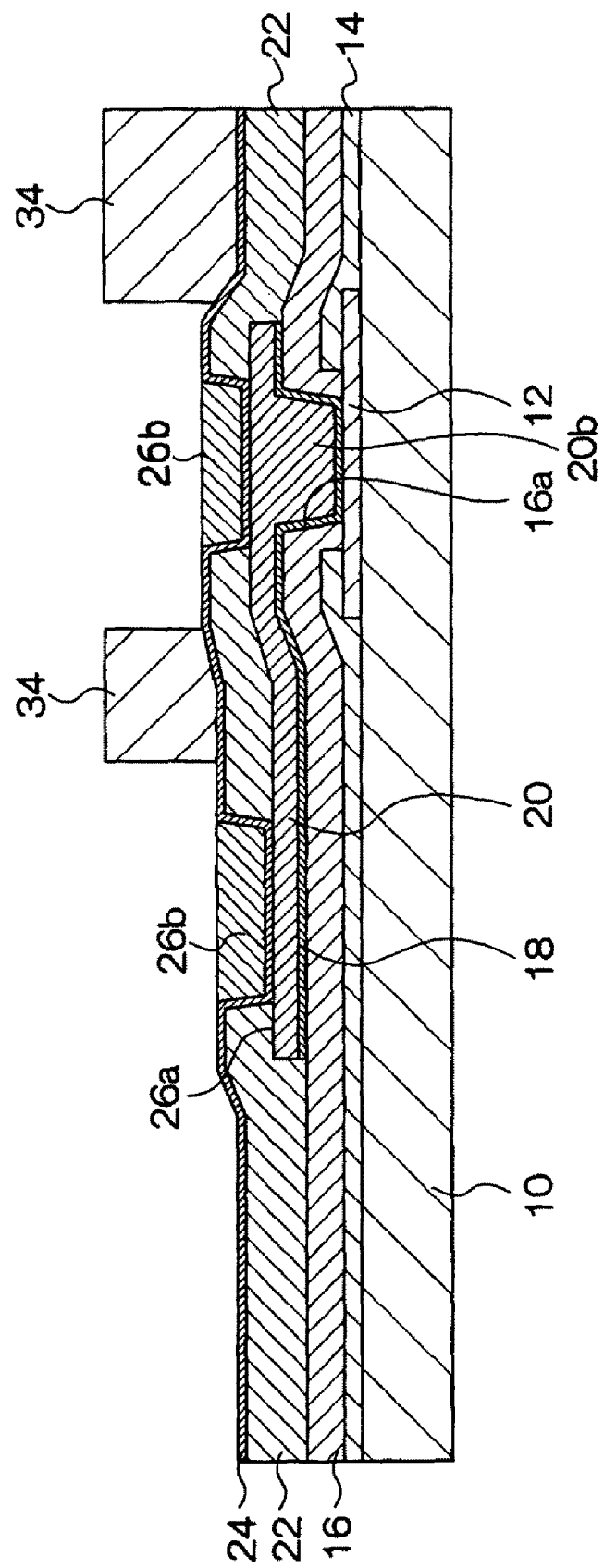
FIG. 25 is a partial cross-section representing a manufacturing process of a semiconductor device according to the third exemplary embodiment of the present invention.

Explanation will now be given of the structure of the semiconductor device 104 according to the third exemplary embodiment, following the manufacturing processes thereof. FIG. 25 is a partial cross-section representing a manufacturing process of a semiconductor device according to the third exemplary embodiment. A partial structure of one electrode pad's worth (one individual semiconductor device) is shown in the drawing.

Processes for Forming the First Insulation Layer, the First Redistribution Layer, and the Second Insulating Layer Since the processes prior to the process for forming the second redistribution layer 26 (see FIG. 2 to FIG. 9) are similar to those of the semiconductor device 100 according to the first exemplary embodiment, the same reference numerals are allocated and explanation is abbreviated. Similar to in the first exemplary embodiment, the first via interconnect 20b and the first redistribution layer 20 are formed integrated together using the two-stage electroplating method.

Processes for Forming the Second Redistribution Layer

Since the processes for forming the second redistribution layer 26 and subsequent processes (see FIG. 17 to FIG. 23) are similar to those of the semiconductor device 102 of the second exemplary embodiment, the same reference numerals are allocated and explanation is abbreviated. Similar to in the second exemplary embodiment, the second redistribution layer 26 is formed by the two-stage electroplating method, after the second via interconnects 26b have been formed to fill-in the second openings 22a.

The second insulating layer 22 is formed on the main surface of the semiconductor wafer 10 formed with the first redistribution layer 20, the second insulating layer 22 being provided with the second openings 22a for exposing portions of the first redistribution layer 20. The second UBM layer 24 is formed as a thin film on the second insulating layer 22. The second UBM layer 24 is formed as a structure that dips inwards at the via portion of the first redistribution layer 20. Next, a resist film 34 is formed on the second UBM layer 24. The resist film 34 is removed in the regions where second via interconnects 26b of the second redistribution layer 26 are to be formed, exposing the surface of the second UBM layer 24. The second electrically conductive material is grown from the exposed surface of the second UBM layer 24 using electroplating, forming the second via interconnects 26b.

Figure 26:
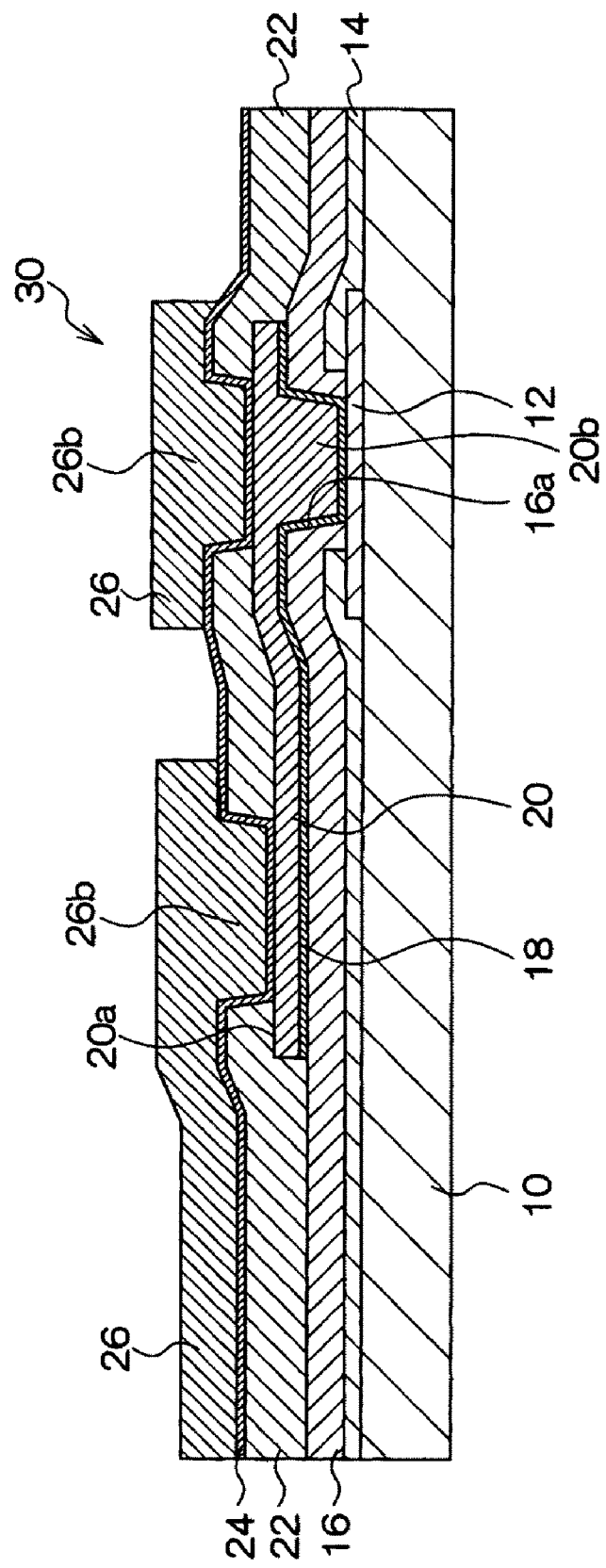
FIG. 26 is a partial cross-section representing a manufacturing process of a semiconductor device according to the third exemplary embodiment of the present invention.

Next, as shown in FIG. 25, the resist film 34 is further removed from the region where the second redistribution layer 26 is to be formed, newly exposing the surface of the second UBM layer 24. Next, as shown in FIG. 26, the second electrically conductive material is grown from the exposed surface of the second UBM layer 24 using electroplating, forming the second redistribution layer 26 that is electrical connected to the second via interconnects 26b. Next, the remaining resist film 34 is removed. The second redistribution layer 26 making contact with the first redistribution layer 20 is thereby completed. The second via interconnects 26b and the second redistribution layer 26 are formed integrated together by the two-stage electroplating method described above. In the present exemplary embodiment this second via interconnect 26b is superimposed on the first via interconnect 20b, configuring the stacked structure 30.

Processes for Forming the Post Electrode

Next, similar to in the first exemplary embodiment (see FIG. 13), the post electrode 28 is formed from a conductive material, using a resist film 36. Finally, the remaining resist film 36 is removed, then the second UBM layer 24 is removed from the portions where the second redistribution layer 26 is not stacked. The surface of the second insulating layer 22 is exposed at portions where the second UBM layer 24 is removed. Thereby, the semiconductor device 104 according to the third exemplary embodiment is completed.

As explained above, in the third exemplary embodiment, due to the above two-stage electroplating method, film forming defects, "fault-breaks" or the like, do not occur when the first redistribution layer 20 is being formed. Thereby occurrences of poor electrical connection between the first redistribution layer 20 and the first via interconnect 20b are suppressed. Similarly, due to the above two-stage electroplating method, film forming defects, "fault-breaks" or the like, do not occur when the second redistribution layer 26 is being formed. Thereby occurrences of poor electrical connection between the second redistribution layer 26 and the second via interconnects 26b, and between the first via interconnect 20b and the second via interconnects 26b, are suppressed.

Furthermore, the surface of the first redistribution layer 20 is made flat, electrical contact with the via portion of the second redistribution layer 26 is improved. The surface of the second redistribution layer 26 is also made flat, further improving the electrical contact with the redistribution layer above, and the via portions thereof. At the same time, variation in thickness of the redistribution layers overall is reduced.

Fourth Exemplary Embodiment

Figure 27:
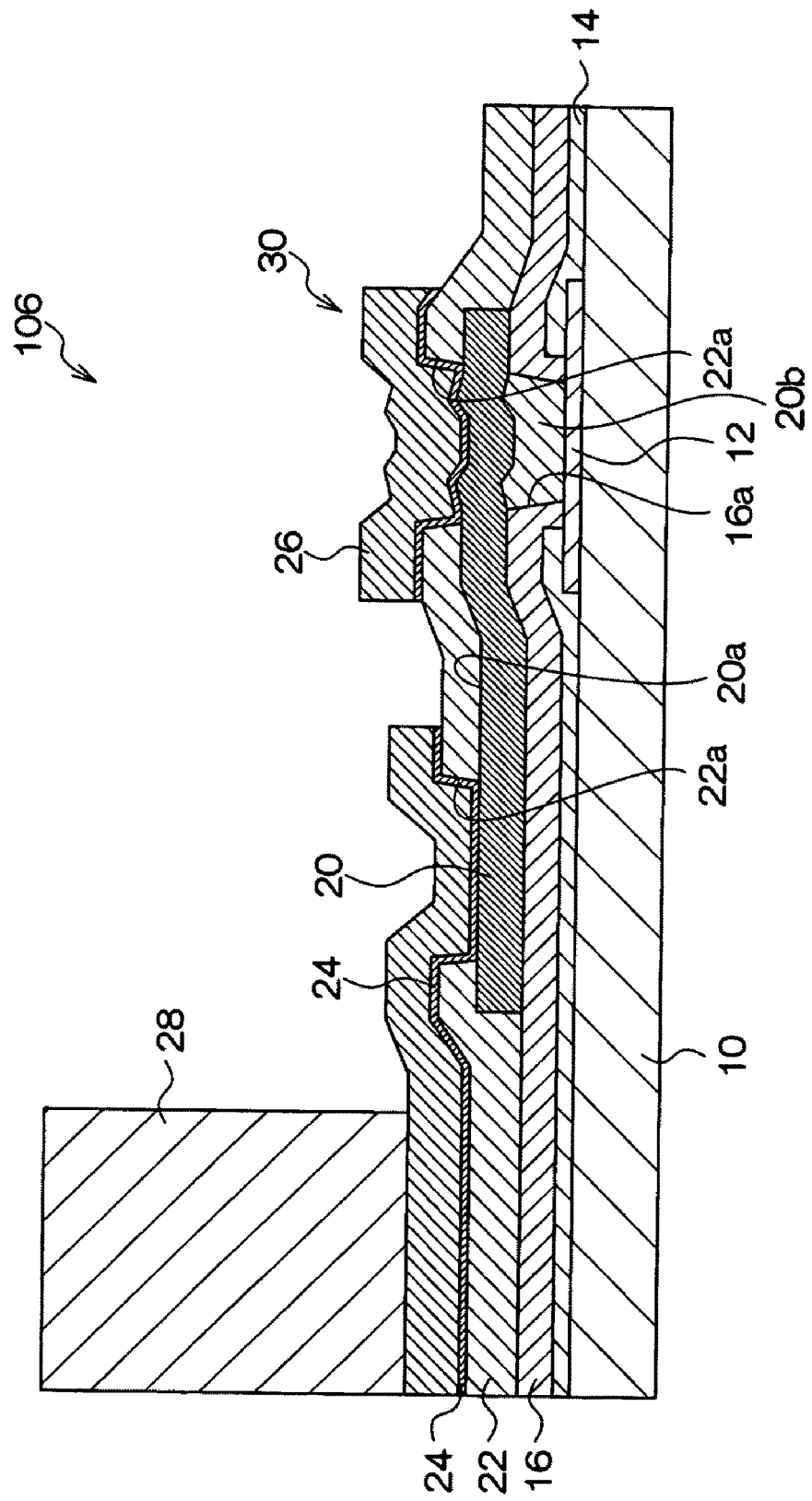
FIG. 27 is a partial cross-section showing an example of a multilayered structure of a semiconductor device according to a fourth exemplary embodiment of the present invention.
Figure 28:
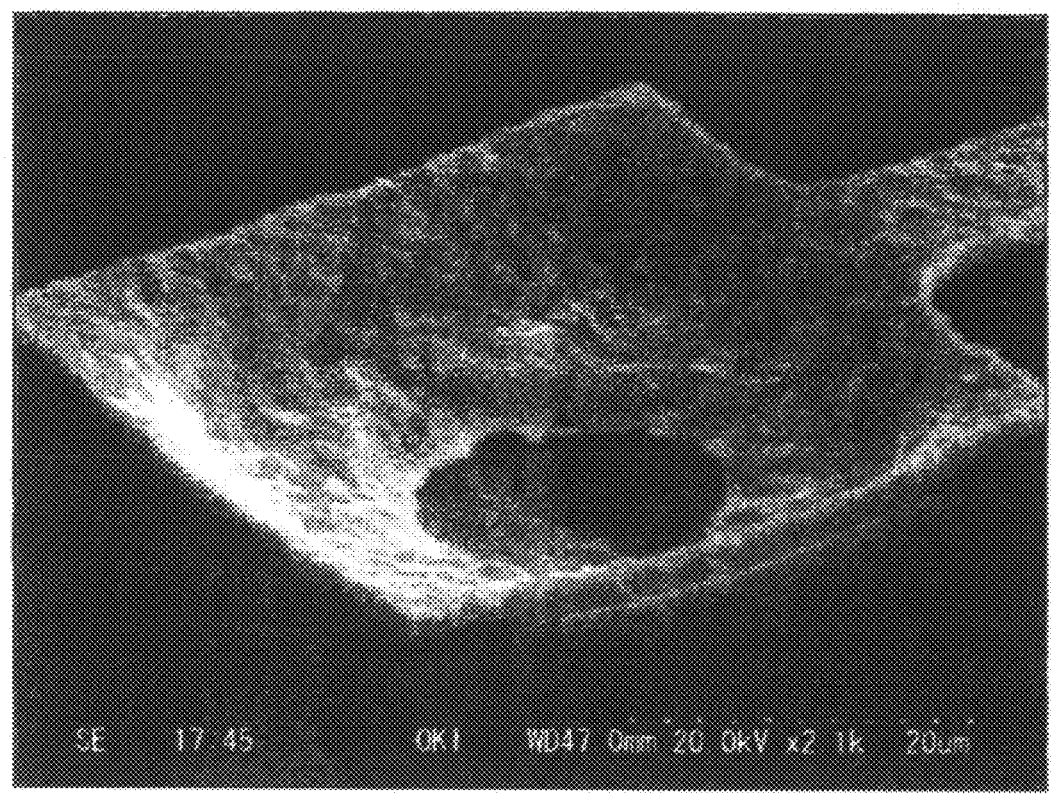
FIG. 28 is photograph showing an example of defective film forming called "fault-breaks"

FIG. 27 is a partial cross-section showing an example of a multilayered structure of a semiconductor device according to a fourth exemplary embodiment of the present invention. A semiconductor device 106 according to the fourth exemplary embodiment is a WCSP of multilayer redistribution structure configured substantially the same as the semiconductor device 100 according to the first exemplary embodiment (see FIG. 1), and is equipped with a semiconductor wafer 10; an electrode pad 12; a passivation film 14; a first insulation layer 16; a first opening 16a; a first redistribution layer 20; a first via interconnect 20b; a second insulating layer 22; a second opening 22a; a second redistribution layer 26; and a post electrode 28.

In the semiconductor device 106, the via portions of the first redistribution layer 20 and the second redistribution layer 26 are respectively superimposed on the electrode pad 12, configuring a stacked structure 30. In the present exemplary embodiment, a "two-stage electroplating method" is applied for the forming process of the first redistribution layer 20. Similar portions to those of the semiconductor device 100 according to the first exemplary embodiment are allocated the same reference numerals and explanation thereof is abbreviated.

Explanation will now be given of the structure of the semiconductor device 106 according to the fourth exemplary embodiment, following the manufacturing processes thereof. FIG. 29 to FIG. 35 are partial cross-sections representing manufacturing processes of a semiconductor device according to the fourth exemplary embodiment. In each drawing, a partial structure of one electrode pad's worth is shown.

Processes for Forming the First Insulation Layer

Figure 29:
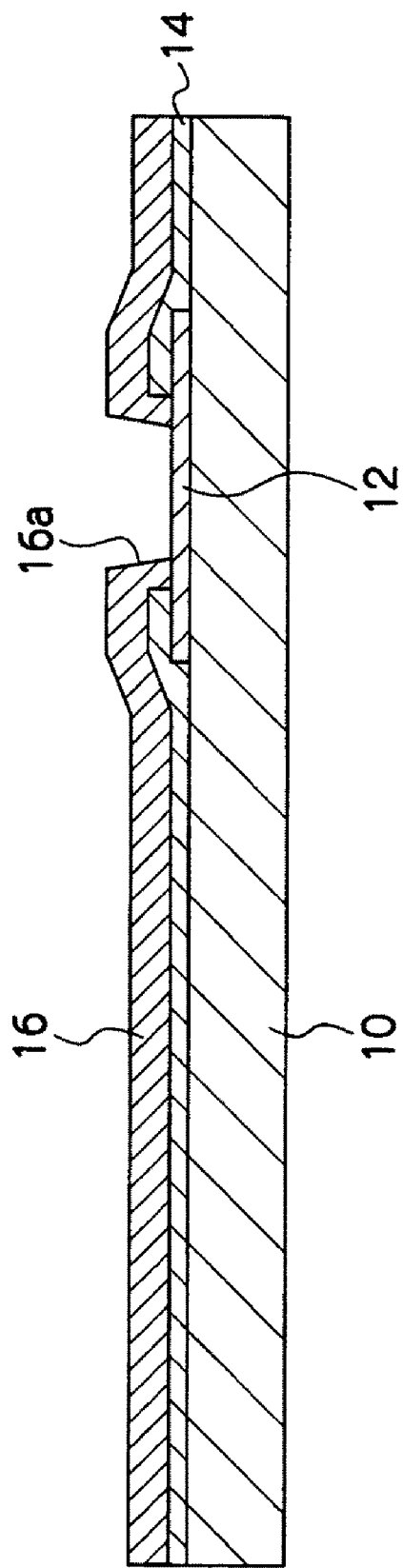
FIG. 29 to FIG. 35 are partial cross-sections representing manufacturing processes of a semiconductor device according to the fourth exemplary embodiment.

First, as shown in FIG. 29, the electrode pad 12 is formed on the surface (main surface side) of the semiconductor wafer 10. Then, the passivation film 14 is formed on the semiconductor wafer 10 and the electrode pad 12, so as to expose a portion of the electrode pad 12. Next, the first insulation layer 16 is formed on the face of the semiconductor wafer 10 using a photosensitive resin, such as (poly)benzoxazole (PBO), or the like. The first opening 16a (first via portion) is formed by photo-exposing and development processing the first insulation layer 16 in order to expose a portion of the electrode pad 12.

Processes for Forming the First Redistribution Layer

Figure 30:
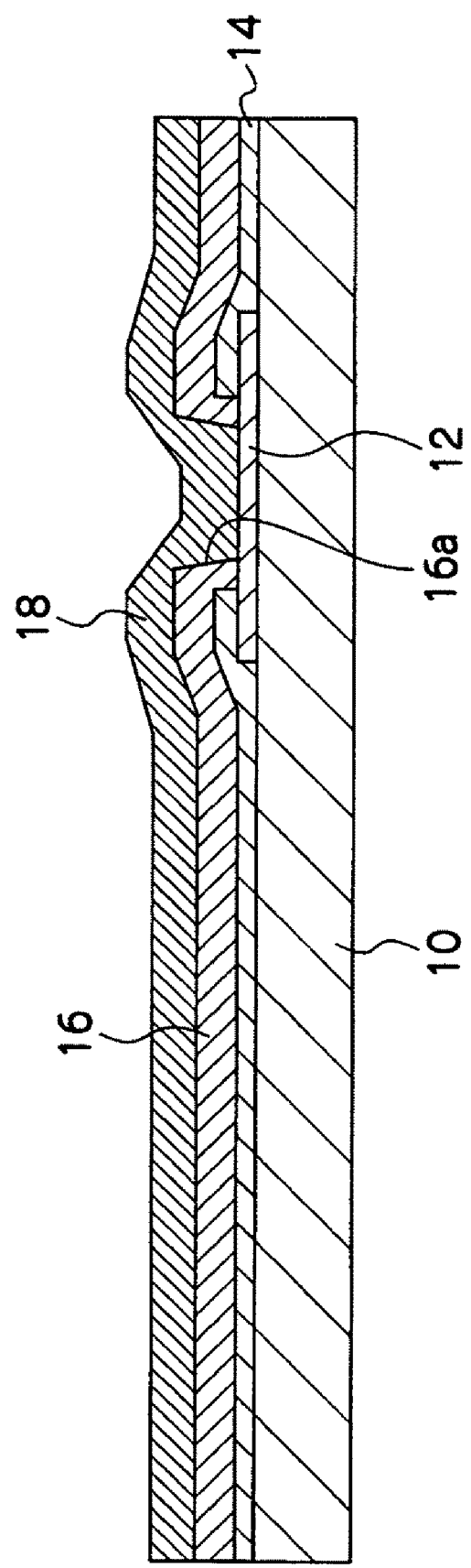

As shown in FIG. 30, after the first insulation layer 16 has been formed, a first electrically conductive material is sputtered on the first insulation layer 16, depositing a first conductive material layer 18 of substantially uniform thickness following the undulations of the surface. Therefore, the first conductive material layer 18 has a structure that dips inwards at the portion where the first opening 16*a* is formed. Cu can, for example, be used as the first electrically conductive material.

Figure 31:
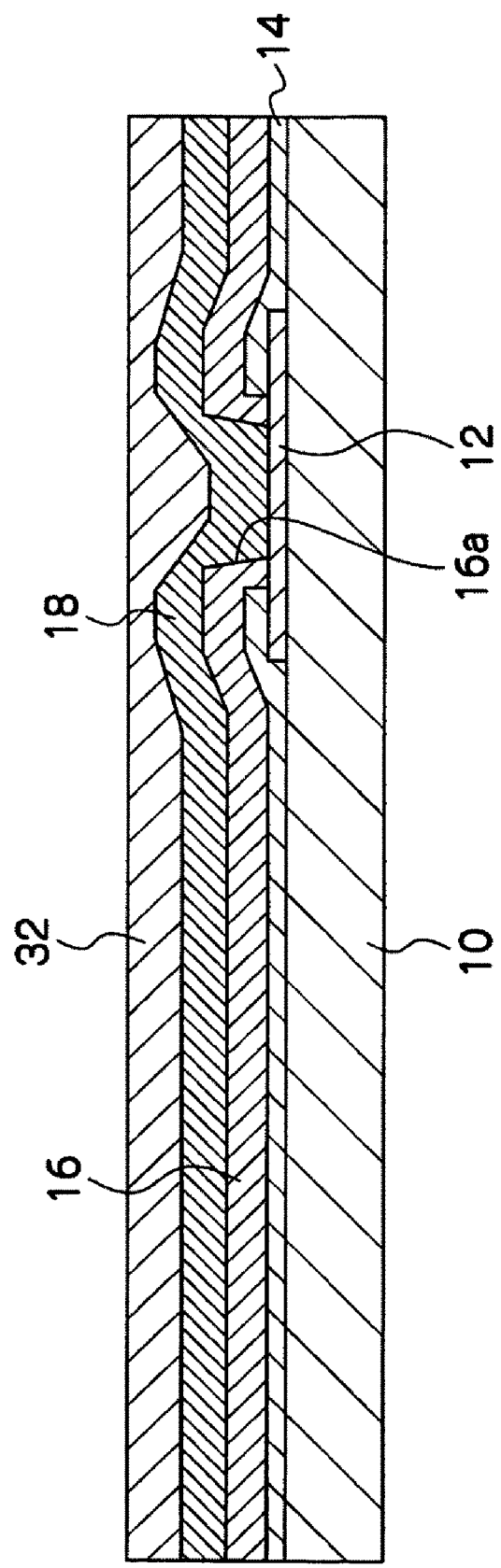
Figure 32:
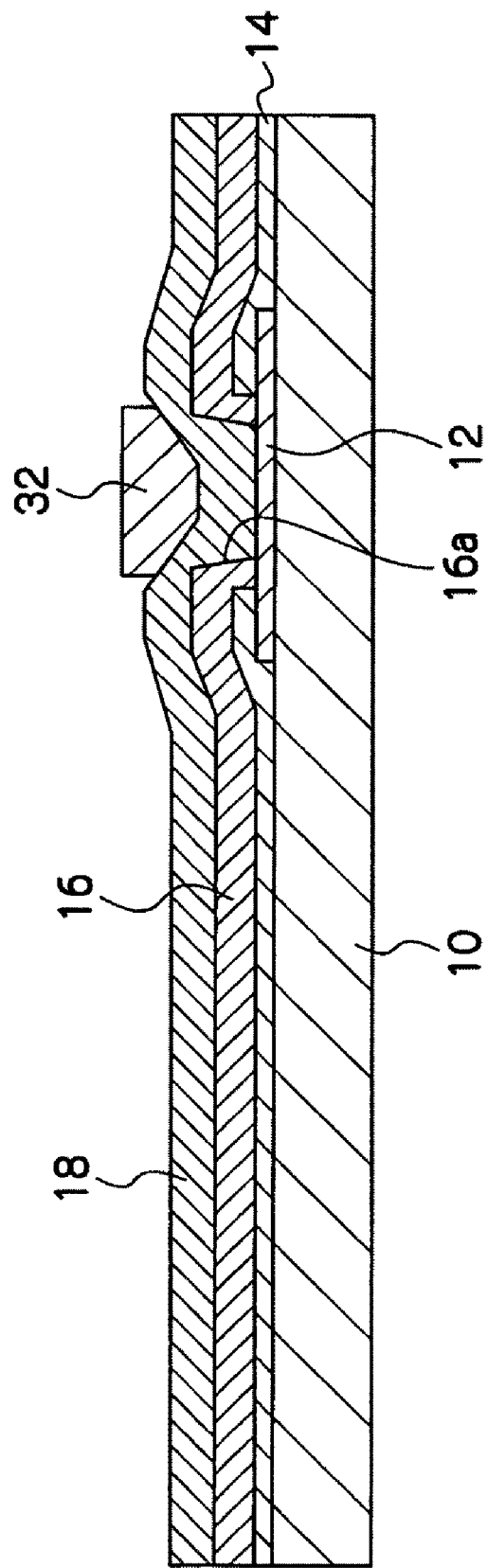

Next, as shown in FIG. 31, a resist film 32 is formed from a photoresist material on the first conductive material layer 18. As shown in FIG. 32, the resist film 32 is patterned by photolithography to give the desired redistribution pattern. Namely, the etching mask 32 is removed from other regions than the region formed with the first via interconnect 20*b*. Namely, the etching mask 32 is formed only on the first opening 16*a*.

Figure 33:
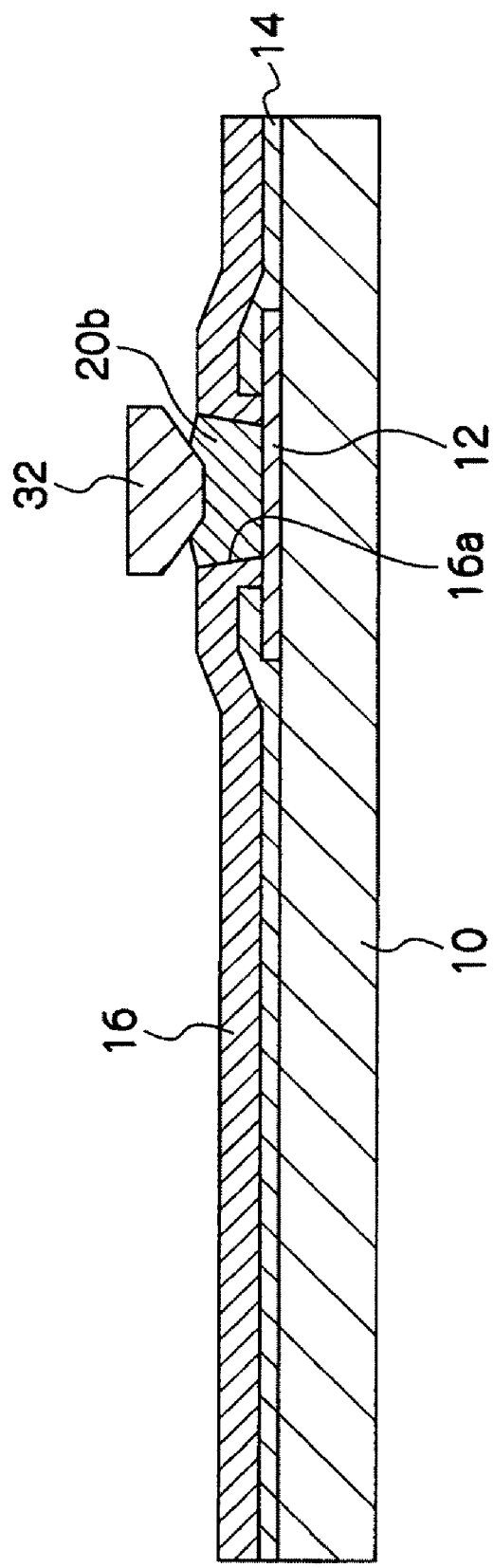

Next, as shown in FIG. 33, the etching mask 32 is employed, and portions that are not required of the first conductive material layer 18 are removed, and the first via interconnect 20*b* is formed filling within the first opening 16*a* (first via portion). A sufficient amount of conductive material is supplied to fill-in the first via portion. The surface of the first via interconnect 20*b* is formed in a position that is just slightly higher than the surface of the first insulation layer 16. For example, when the thickness of the first via interconnect 20*b* is about 8 micro meters, the time required for producing by sputtering is about 1 hour. As stated, there is the disadvantage compared with electroplating in that the manufacturing time becomes longer, however, by sputtering, a more uniform metal film is formed by metal vacuum deposition, and interconnects with excellent electrical properties, such as Vt and the like, can be obtained.

Figure 34:
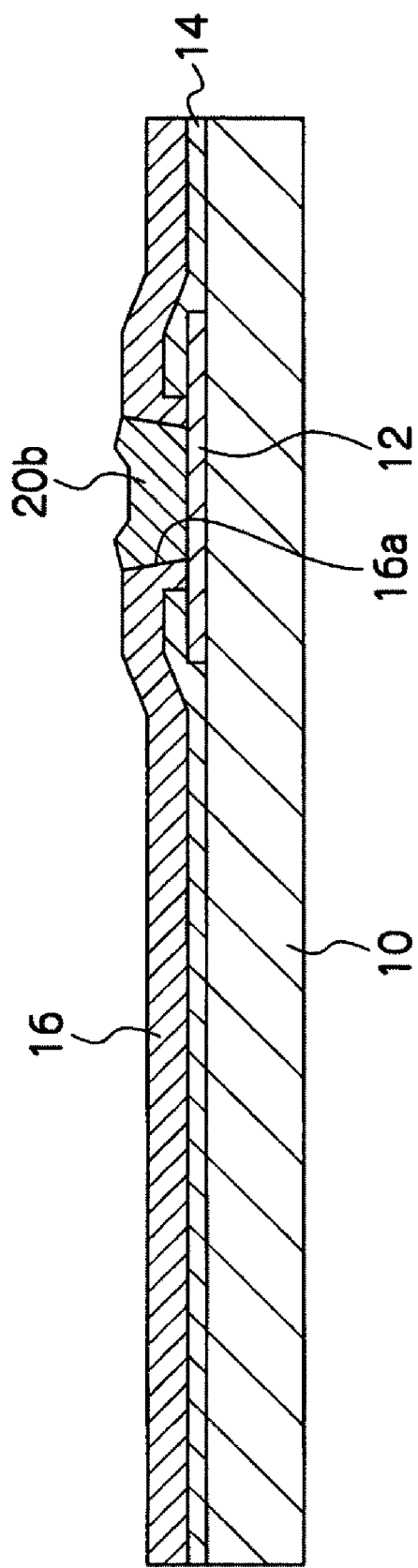
Figure 35:
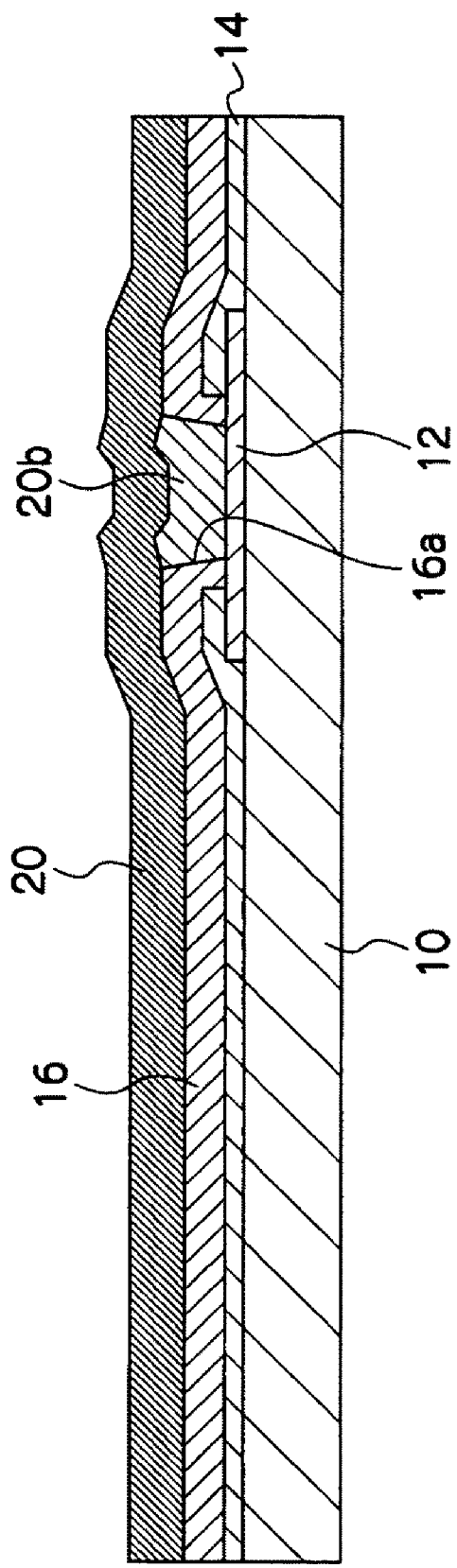

Next, as shown in FIG. 34, the etching mask 32 is removed, and the surface of the first insulation layer 16 is newly exposed. Next, as shown in FIG. 35, by sputtering the first electrically conductive material onto the exposed surface of the first insulation layer 16, the first redistribution layer 20 is deposited with a substantially uniform thickness that follows the contours of the surface. Thereby, the first redistribution layer 20 making contact with the electrode pad 12 is completed. For example, the thickness of the first redistribution layer 20 can be made to be about 8 micro meters, similar to that of the first via interconnect 20*b*.

In the above two-stage sputtering method, sufficient of the conductive material is supplied into the first opening 16*a*, and the first via interconnect 20*b* is formed. Therefore, when the first redistribution layer 20 is being formed the conductive material does not enter the already formed first via interconnect 20*b*, and film forming defects, "fault-breaks" or the like, do not occur. The first redistribution layer 20 and the first via interconnect 20*b* are integrated together in this manner, suppressing occurrences of poor electrical connection between the first redistribution layer 20 and the first via interconnect 20*b*.

Processes for Forming Second Insulating Layer

Since the processes for forming the second redistribution layer 26 and subsequent processes (see FIG. 9 to FIG. 13) are similar to those of the semiconductor device 100 according to the first exemplary embodiment, the same reference numerals are allocated thereto, and explanation is abbreviated. The second via interconnect 26*b* and the first redistribution layer 20 are formed integrated together by the two-stage sputtering method, similar to in the first exemplary embodiment.

The second insulating layer 22 is formed from a photosensitive resin, such as PBO or the like, on the main surface of the semiconductor wafer 10 formed with the first redistribution layer 20. At least one of the second opening 22*a* is formed by photo-exposing and development processing the second insulating layer 22, in order to expose a portion of the first redistribution layer 20. The size of the second opening 22*a* formed above the first via interconnect 20*b* is larger than the size of the first opening 16*a*, and the second insulating layer 22 is removed at the portion facing the first opening 16*a* (the first via interconnect 20*b*) (see FIG. 9).

Processes for Forming the Second Redistribution Layer

The second UBM layer 24 is formed as a thin film of substantially uniform thickness on the second insulating layer 22 and the first redistribution layer 20, following the undulations of the surface. A second electrically conductive material for forming the second redistribution layer 26 is contained in the second UBM layer 24. In a case of copper lines, the UBM layer is formed from Ti and Cu. Next, a resist film 34 is formed from a photoresist material on the second UBM layer 24. The resist film 34 is patterned with the desired redistribution pattern by photolithography. Namely, the resist film 34 is removed in the region where the second redistribution layer 26 is to be formed, exposing the surface of the second UBM layer 24 (see FIG. 10).

Next, the second redistribution layer 26 is formed by growing the second electrically conductive material from the exposed surface of the second UBM layer 24 using electroplating, and the remaining resist film 34 is removed. The second redistribution layer 26 making contact with the first redistribution layer 20 is thereby completed. The second redistribution layer 26 is formed of substantially uniform thickness following the undulations of the surface, to give a structure that dips inward at the portion where the second opening 22*a* is formed. In the present exemplary embodiment, this portion corresponds to the via portion of the second redistribution layer 26 (see FIG. 11 and FIG. 12).

The via portion of the second redistribution layer 26 is superimposed on the via portion (first via interconnect 20*b*) of the first redistribution layer 20, configuring the stacked structure 30. The surface 20*a* of the first redistribution layer 20 is substantially flat. The electrical contact between the second redistribution layer 26 and of the first redistribution layer 20 is thereby improved, in comparison to cases where there are large undulations in the surface 20*a* of the first redistribution layer 20.

Processes for Forming the Post Electrode

Next, a dry film resist DF 36 is stuck on the main surface of the semiconductor wafer 10 formed with the second redistribution layer 26. The dry film resist DF 36 is patterned with the desired pattern using photolithography. Namely, the dry film resist DF 36 is removed from the region where the post electrode 28 is to be formed, exposing the surface of the second redistribution layer 26. As shown in FIG. 27, the post electrode 28 is formed by growing the second electrically conductive material from the exposed surface of the second redistribution layer 26 using electroplating (see FIG. 13).

Finally, the remaining resist film 36 is removed, then the second UBM layer 24 is removed at the portions where the second redistribution layer 26 is not stacked. As described above, when, for example, the UBM layer is made from Ti and Cu, the Cu layer is removed by etching, and then the Ti layer is removed by etching. The surface of the second insulating layer 22 is exposed where the second UBM layer 24 has been removed. Thereby, the semiconductor device 106 according to the fourth exemplary embodiment is completed (see FIG. 13).

Note that in the fourth exemplary embodiment explanation has been given of a case in which the second via interconnect 26*b* and the second redistribution layer 26 are produced using an ordinary electroplating method. However, in the fourth exemplary embodiment, the second UBM layer 24 is formed as a thin film of substantially uniform thickness on the second insulating layer 22 and the first redistribution layer 20, following the undulations of the surface. Therefore, similar to in the second exemplary embodiment, the two-stage electroplating method can be applied, with the second redistribution layer 26 formed by an electroplating method after the second via interconnect 26b has been formed by an electroplating method (see FIG. 17 to FIG. 23). By application of the two-stage electroplating method, film forming defects, "fault-breaks" or the like, do not occur when the second redistribution layer 26 is being formed. Thereby occurrences of poor electrical connection between the second redistribution layer 26 and the second via interconnect 26b, and between the first redistribution layer 20 and the first via interconnect 20b, are suppressed.

As explained above, in the fourth exemplary embodiment, by the two-stage sputtering method, sufficient of the conductive material is supplied into the first opening 16a, and the first via interconnect 20b is formed. Therefore, when the first redistribution layer 20 is being formed the conductive material does not enter the already formed first via interconnect 20b, and film forming defects, "fault-breaks" or the like, do not occur. Thereby, occurrences of poor electrical connection between the first redistribution layer 20 and the first via interconnect 20b are suppressed.

The surface 20a of the first redistribution layer 20 is substantially flat. The electrical contact between the via portion of the first redistribution layer 20 and the via portion of the second redistribution layer 26 is thereby improved at the stacked structure 30, in comparison to cases where there are large undulations in the surface 20a of the first redistribution layer 20.

Fifth Exemplary Embodiment

Figure 36:
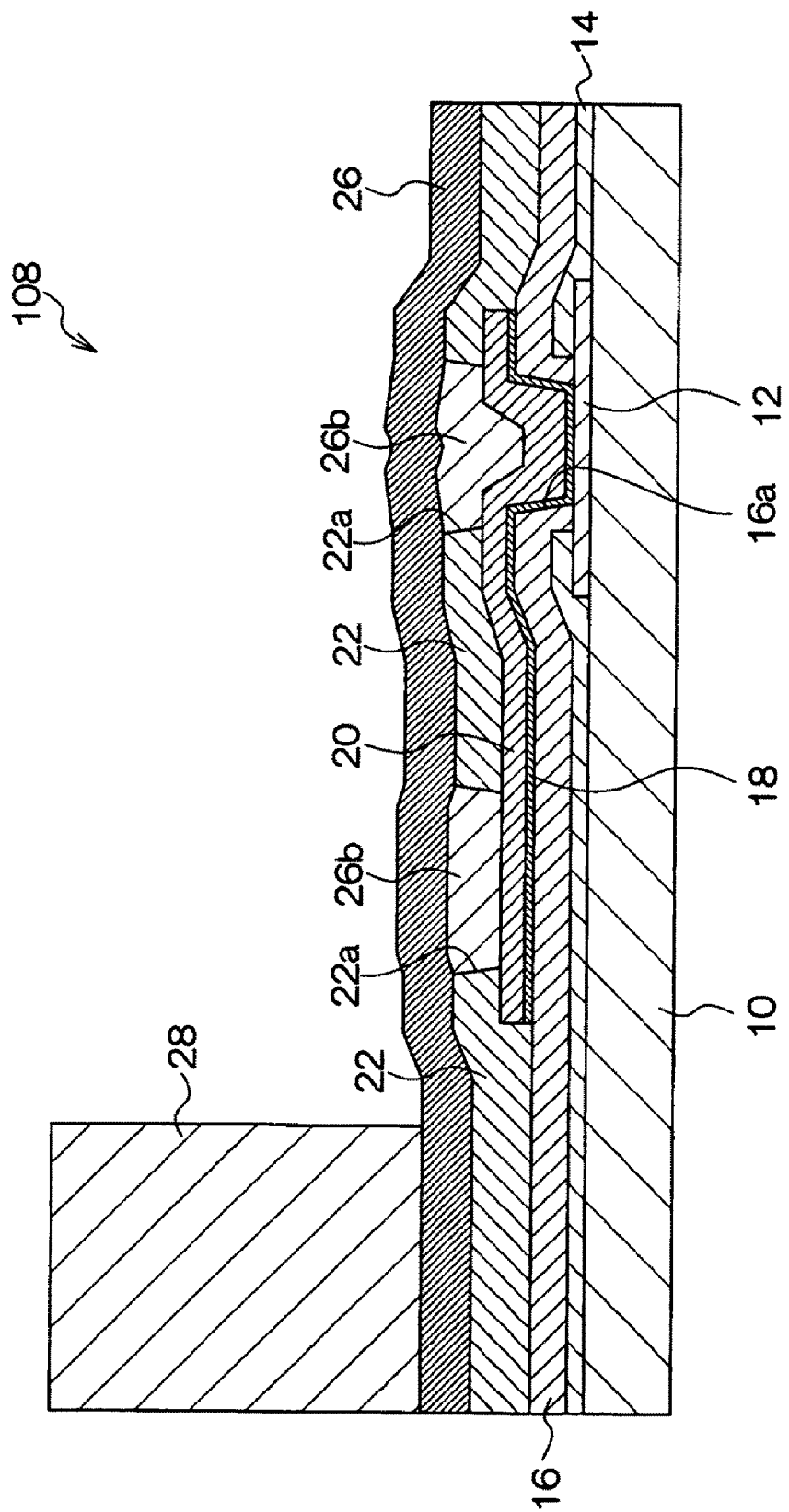
FIG. 36 is a partial cross-section showing an example of a multilayered structure of a semiconductor device according to a fifth exemplary embodiment of the present invention.

FIG. 36 is a partial cross-section showing an example of a multilayered structure of a semiconductor device according to a fifth exemplary embodiment of the present invention. A semiconductor device 108 according to the fifth exemplary embodiment is, similar to the semiconductor device 100 according to the first exemplary embodiment (see FIG. 1), equipped with: a semiconductor wafer 10; an electrode pad 12; a passivation film 14; a first insulation layer 16; a first opening 16a; an first UBM layer 18; a first redistribution layer 20; a second insulating layer 22; second openings 22a; a second redistribution layer 26; second via interconnects 26b; and a post electrode 28.

In the semiconductor device 108, the via portions of the first redistribution layer 20 and the second redistribution layer 26 are respectively superimposed on the electrode pad 12, configuring a stacked structure 30. In the present exemplary embodiment, a "two-stage sputtering method" is applied for the forming process of the second redistribution layer 26. Similar portions to those of the semiconductor device 100 according to the first exemplary embodiment are allocated the same reference numerals and explanation thereof is abbreviated.

Explanation will now be given of the structure of the semiconductor device 108 according to the fifth exemplary embodiment, following the manufacturing processes thereof. FIG. 37 to FIG. 43 are partial cross-sections representing manufacturing processes of a semiconductor device according to the fifth exemplary embodiment. In each drawing, a partial structure of one electrode pad's worth is shown.

Processes for Forming the First Insulation Layer and the First Redistribution Layer The processes prior to the process for forming the second redistribution layer 26 (see FIG. 2, FIG. 15, and FIG. 16) are substantially the same as those of the semiconductor device 102 according to the second exemplary embodiment, and so the same reference numerals are allocated and explanation thereof is abbreviated.

Processes for Forming the Second Insulating Layer

Figure 37:
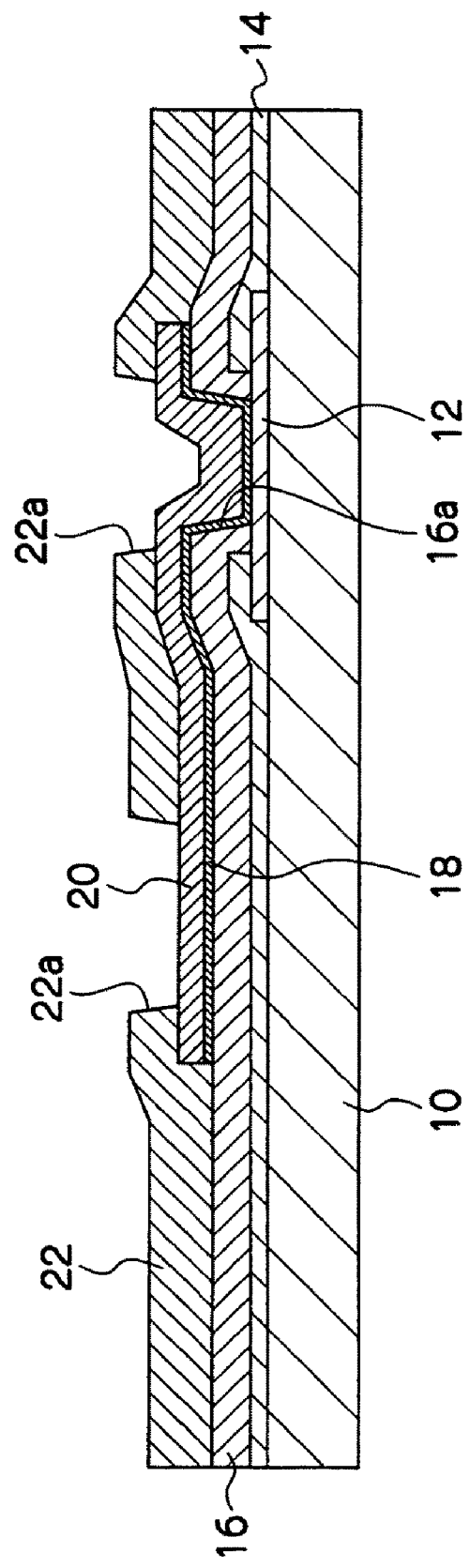
FIG. 37 to FIG. 43 are partial cross-sections representing manufacturing processes of a semiconductor device according to the fifth exemplary embodiment.

As shown in FIG. 37, the second insulating layer 22 is formed from a photosensitive resin, such as PBO or the like, on the main surface of the semiconductor wafer 10 formed with the first redistribution layer 20. The second openings 22a are formed by photo-exposing and development processing the second insulating layer 22, in order to expose portions of the first redistribution layer 20. The size of the second openings 22a is larger than the size of the first opening 16a, and the second insulating layer 22 is removed at the portion facing the first opening 16a.

Processes for Forming the Second Redistribution Layer

Figure 38:
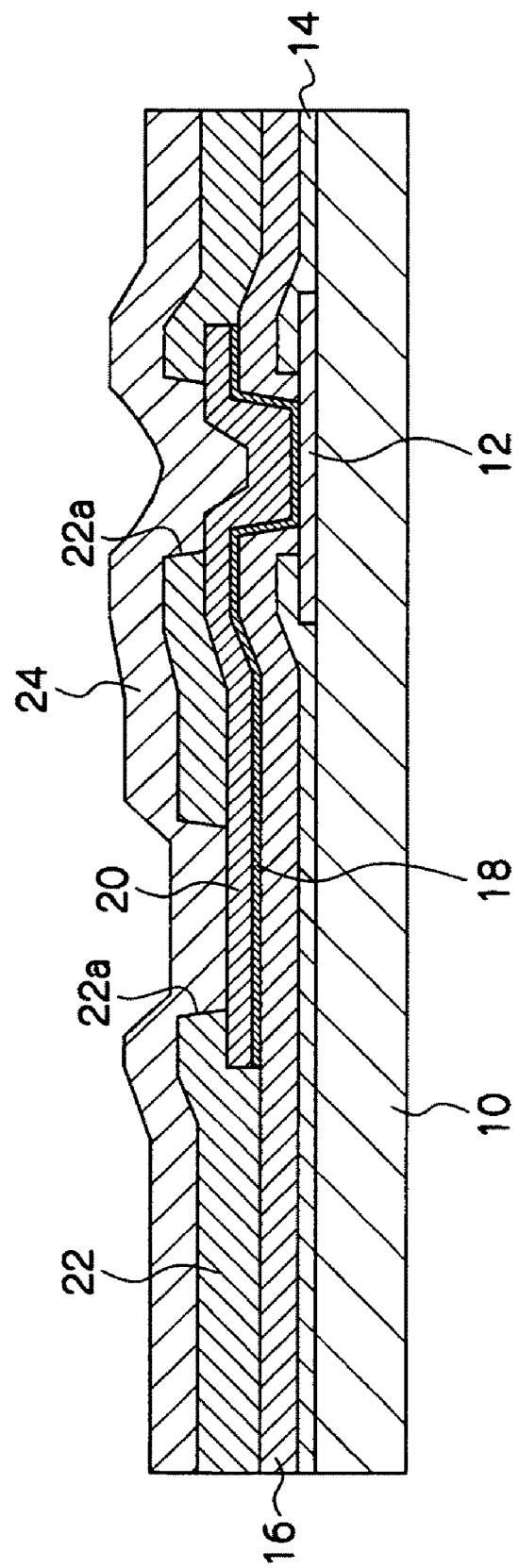

As shown in FIG. 38, after the second insulating layer 22 has been formed, the second electrically conductive material layer 24 is deposited by sputtering the second electrically conductive material on the second insulating layer 22, forming a thin film of substantially uniform thickness following the undulations of the surface. Hence, the second electrically conductive material layer 24 is of a structure that dips inwards at the portion where the second openings 22a are formed. Cu may be used, for example, for the second electrically conductive material.

Figure 39:
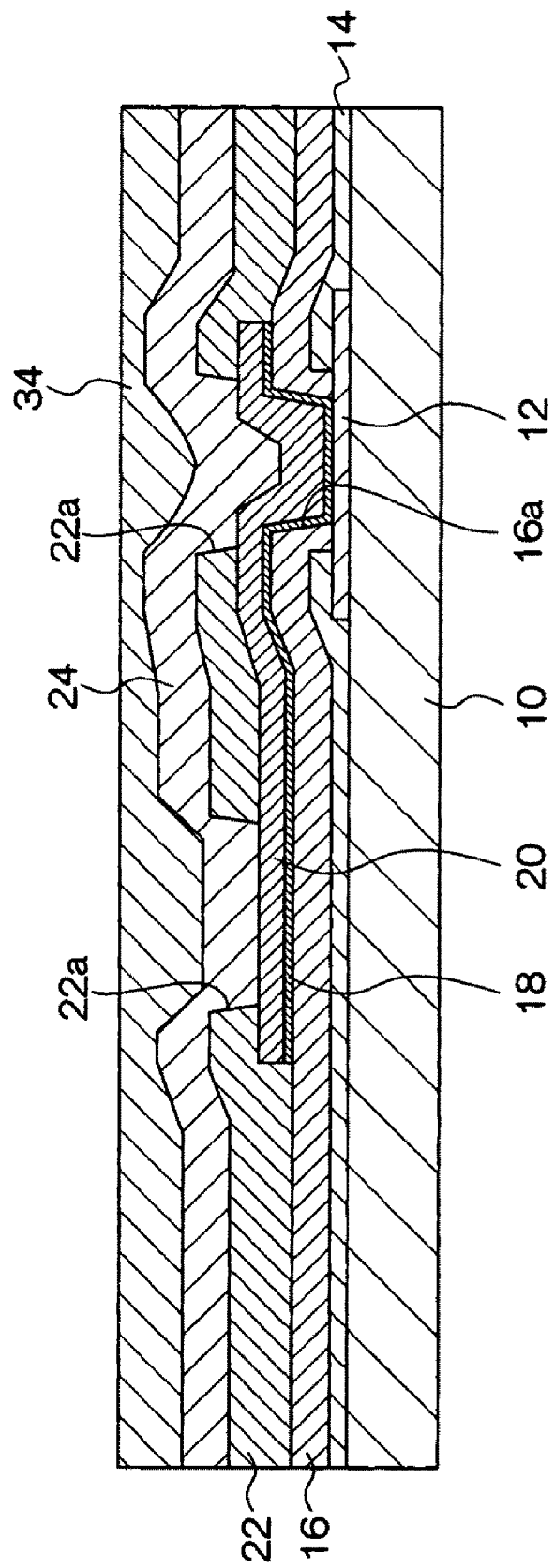
Figure 40:
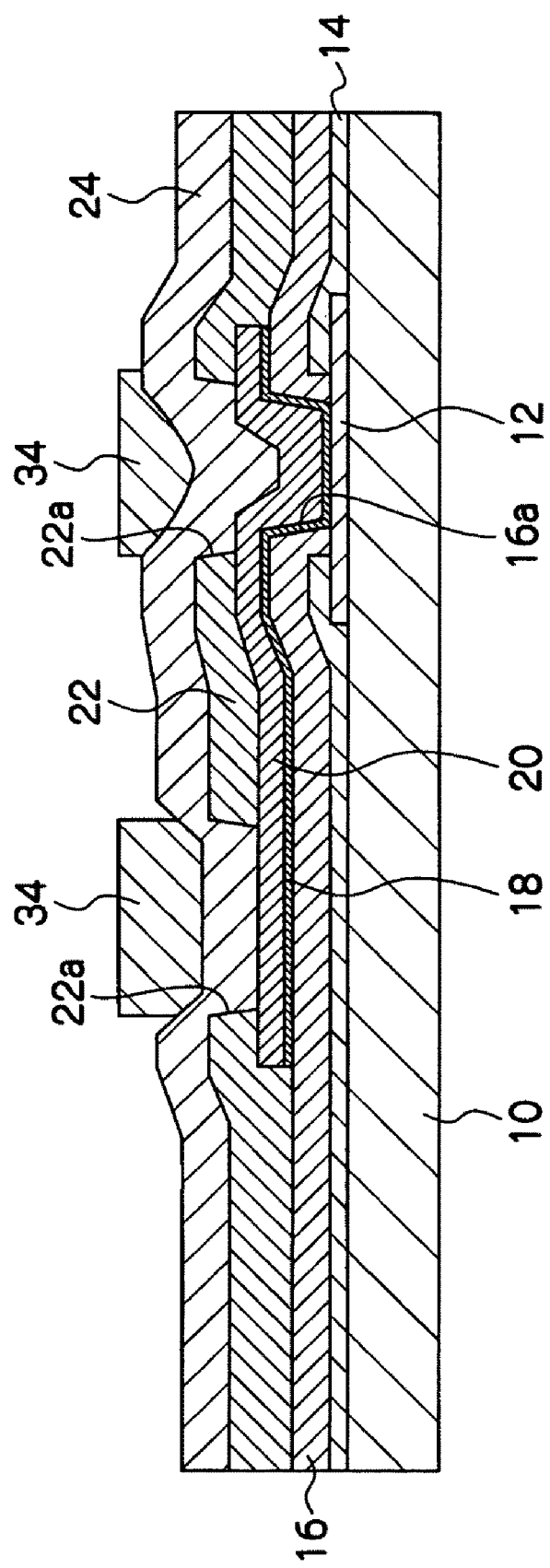

Next, as shown in FIG. 39, a resist film 34 is formed from a photoresist material on the second electrically conductive material layer 24. As shown in FIG. 40, the resist film 34 is patterned with the desired redistribution pattern using photolithography. Namely, the etching mask 34 is removed from regions other than the region where the second via interconnect 26b is to be formed. Namely, the etching mask 34 is only formed on the second opening 22a.

Figure 41:
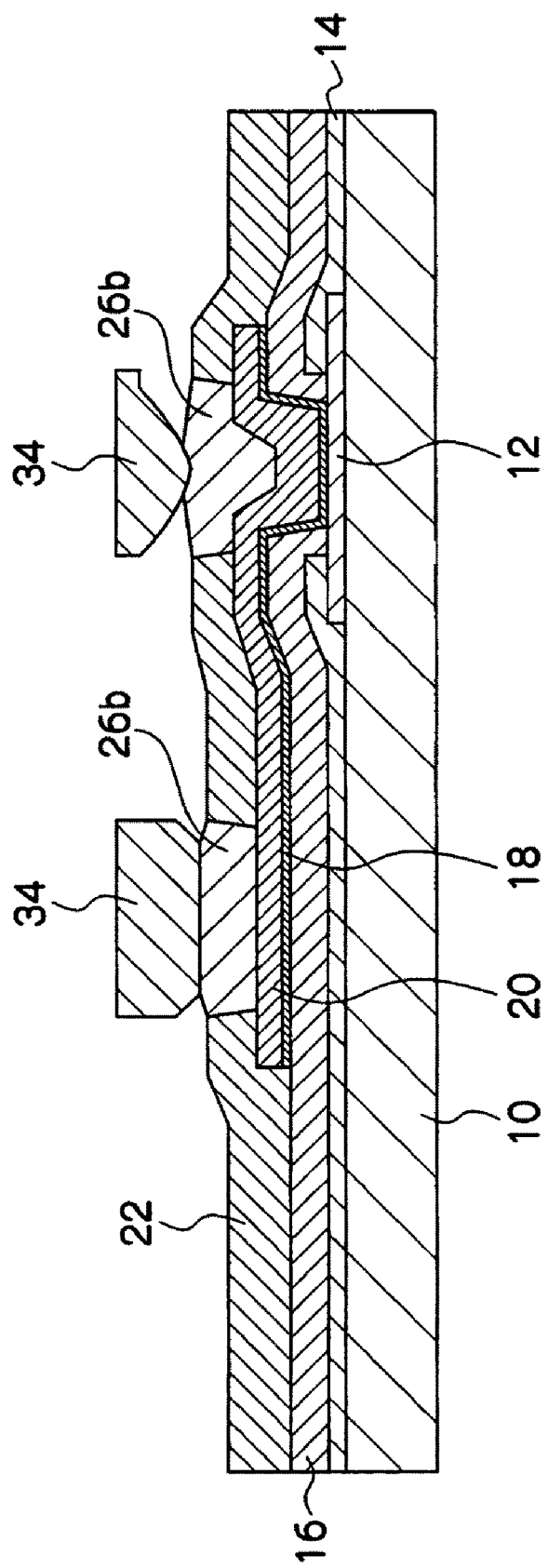

Next, as shown in FIG. 41, the etching mask 34 is employed and portions that are not required of the second electrically conductive material layer 24 are removed, and the second via interconnect 26b are formed filling the second openings 22a (second via portions). A sufficient amount of conductive material is supplied to fill-in the second via portions. The surfaces of the second via interconnects 26b are formed in positions that are just slightly higher than the surface of the second insulating layer 22. For example, when the thickness of the second via interconnects 26b is about 8 micro meters, the time required for producing by sputtering is about 1 hour. As stated, there is the disadvantage compared with electroplating in that the manufacturing time becomes longer, however, by sputtering a more uniform metal film is formed by metal vacuum deposition, and interconnects with excellent electrical properties, such as Vt and the like, can be obtained.

Figure 42:
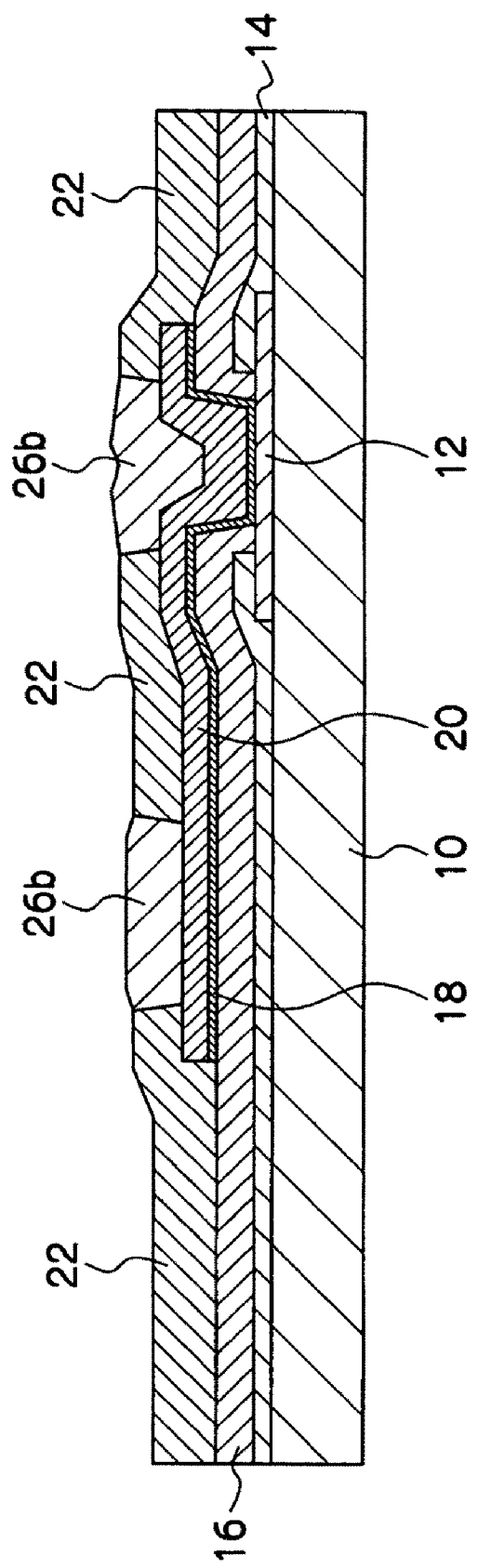
Figure 43:
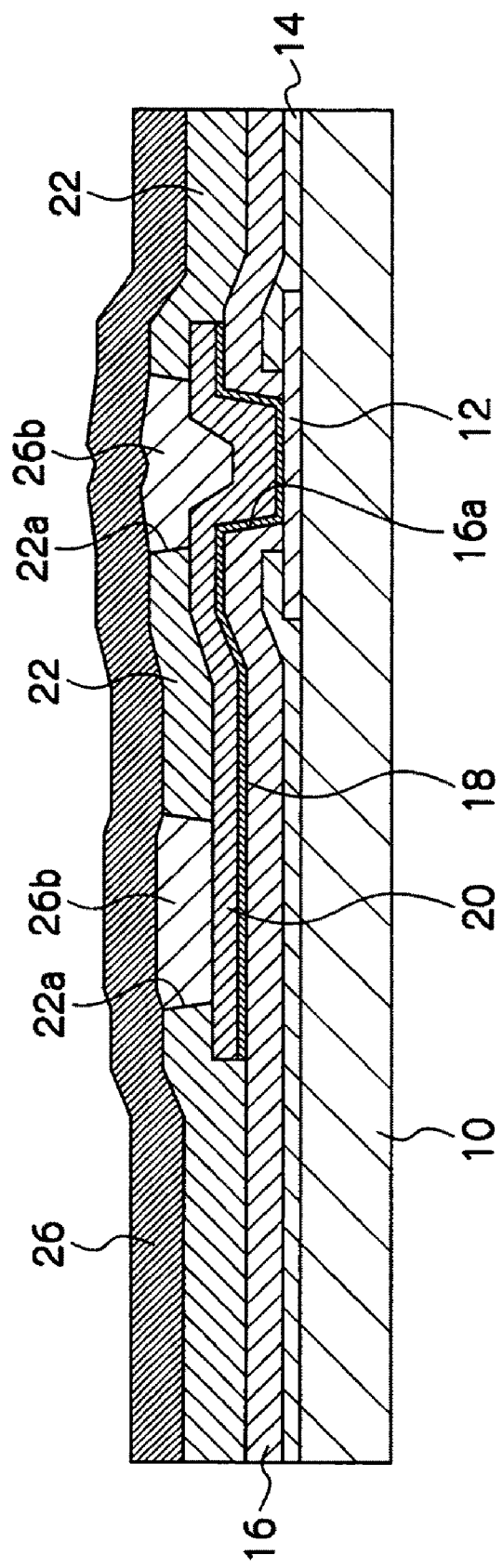

Next, as shown in FIG. 42, the etching mask 34 is removed, and the surface of the second insulating layer 22 is newly exposed. Next, as shown in FIG. 43, by sputtering the second electrically conductive material onto the exposed surface of the second insulating layer 22, the second redistribution layer 26 is deposited with a substantially uniform thickness that follows the contours of the surface. Thereby, the second redistribution layer 26 making contact with the first redistribution layer 20 is completed. The thickness of the second redistribution layer 26 can, for example, be made to be about 8 micro meters, similar to that of the second via interconnects 26b.

In the above two-stage sputtering method, the portions corresponding to the second openings 22a of the second redistribution layer 26 are thicker than other portions of the second redistribution layer 26. In particular, the portion corresponding to the via portion of the first redistribution layer 20 is thicker than the other portions of the second redistribution layer 26. In the present exemplary embodiment, the second via interconnects 26b is superimposed on the via portion of the first redistribution layer 20, configuring a stacked structure 30.

In the two-stage sputtering method described above, sufficient of the conductive material is supplied into second opening 22a that dips at the center, and the second via interconnect 26b is formed. Therefore, when the second redistribution layer 26 is being formed, the conductive material does not enter the already formed second via interconnect 26b, and film forming defects, "fault-breaks" or the like, do not occur. The second redistribution layer 26 and the second via interconnects 26b are integrated together in this manner, suppressing occurrences of poor electrical connection between the second redistribution layer 26 and the second via interconnects 26b and between the first via interconnect 20b and the second via interconnect 26b.

Processes for Forming the Post Electrode

Next, similar to in the fourth exemplary embodiment, a post electrode 28 is formed to the main surface of the semiconductor wafer 10 formed with the second redistribution layer 26, and portions not required are removed. Thereby, the semiconductor device 108 according to the fifth exemplary embodiment is completed.

As explained above, in the fifth exemplary embodiment, by the two-stage sputtering method, a sufficient amount of the conductive material is supplied into the second opening 22a that dips at the center thereof, and the second via interconnect 26b is formed. Therefore, when the second redistribution layer 26 is being formed, the conductive material does not enter the already formed second via interconnect 26b, and film forming defects, "fault-breaks" or the like, do not occur. Thereby, occurrences of poor electrical connection between the second redistribution layer 26 and the second via interconnects 26b, and between the first via interconnect 20b and the second via interconnect 26b, is suppressed.

The surface of the second redistribution layer 26 is made substantially flat, and in addition to further improving the electrical contact between the redistribution layer in the layer above and the via portion thereof, variation in the thickness of the redistribution layers overall is reduced.

Sixth Exemplary Embodiment

Figure 44:
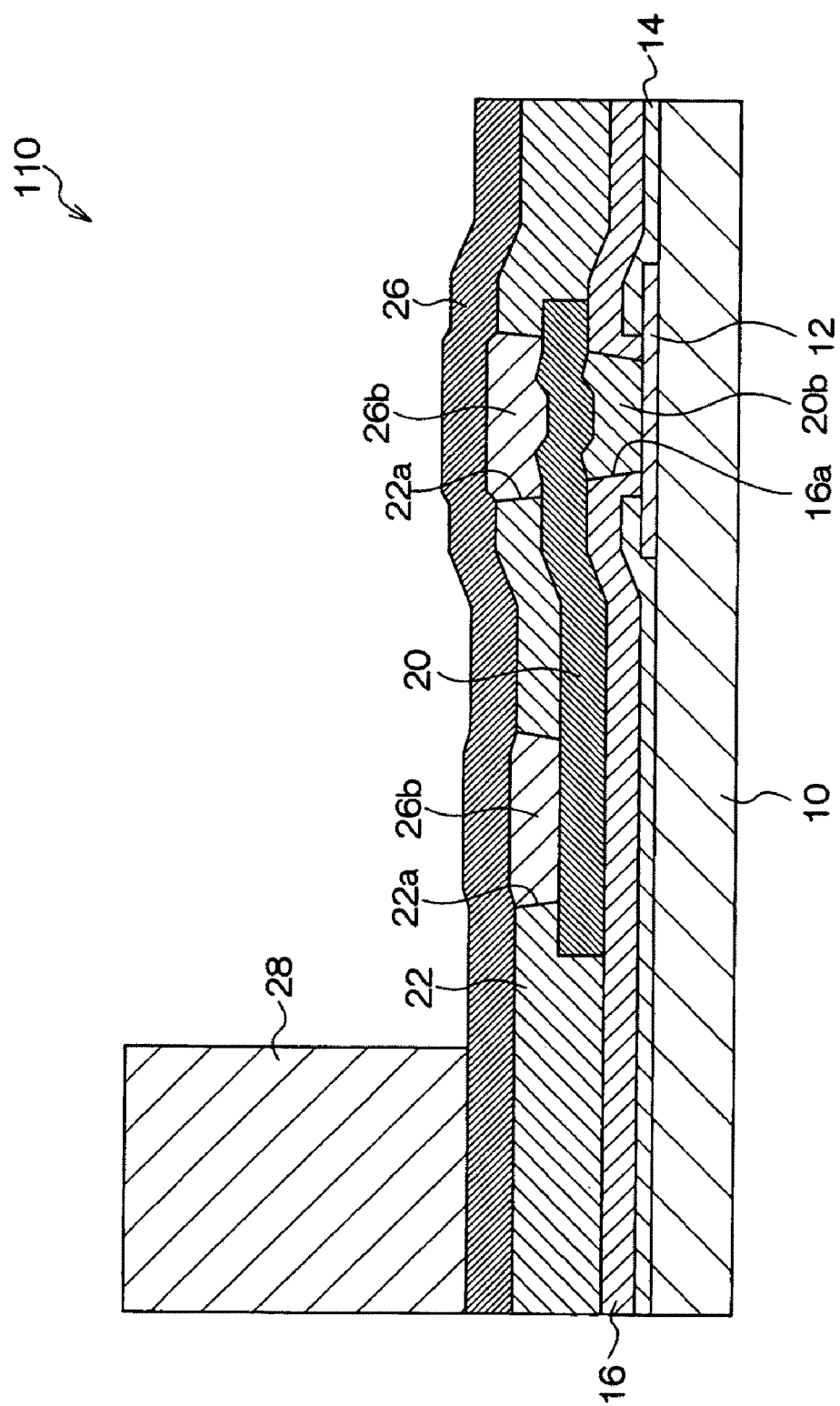
FIG. 44 is a partial cross-section showing an example of a multilayered structure of a semiconductor device according to a sixth exemplary embodiment of the present invention.
Figure 45:
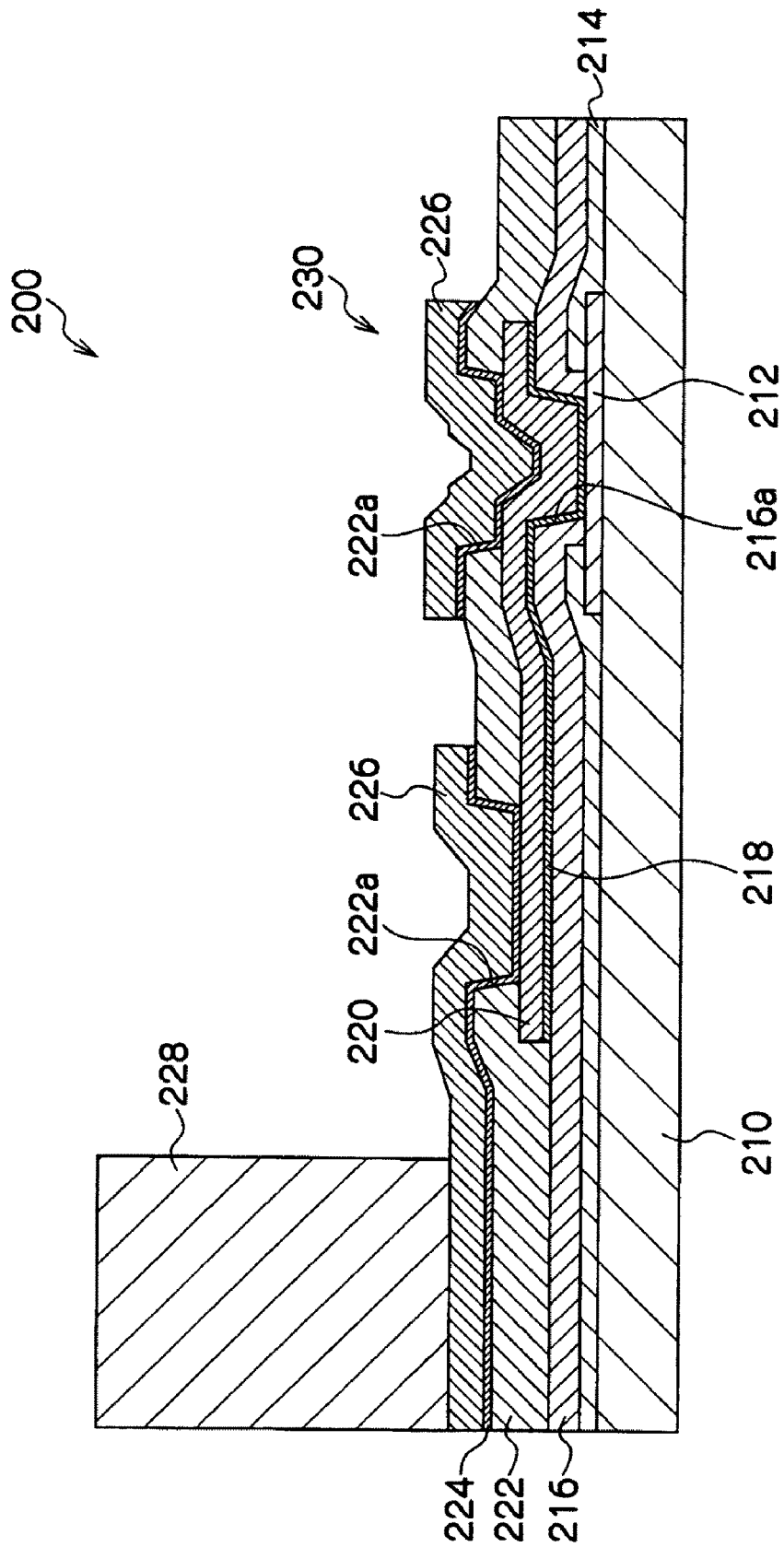
FIG. 45 is a configuration diagram showing an example of a multilayered structure of a conventional semiconductor device.
Figure 46:
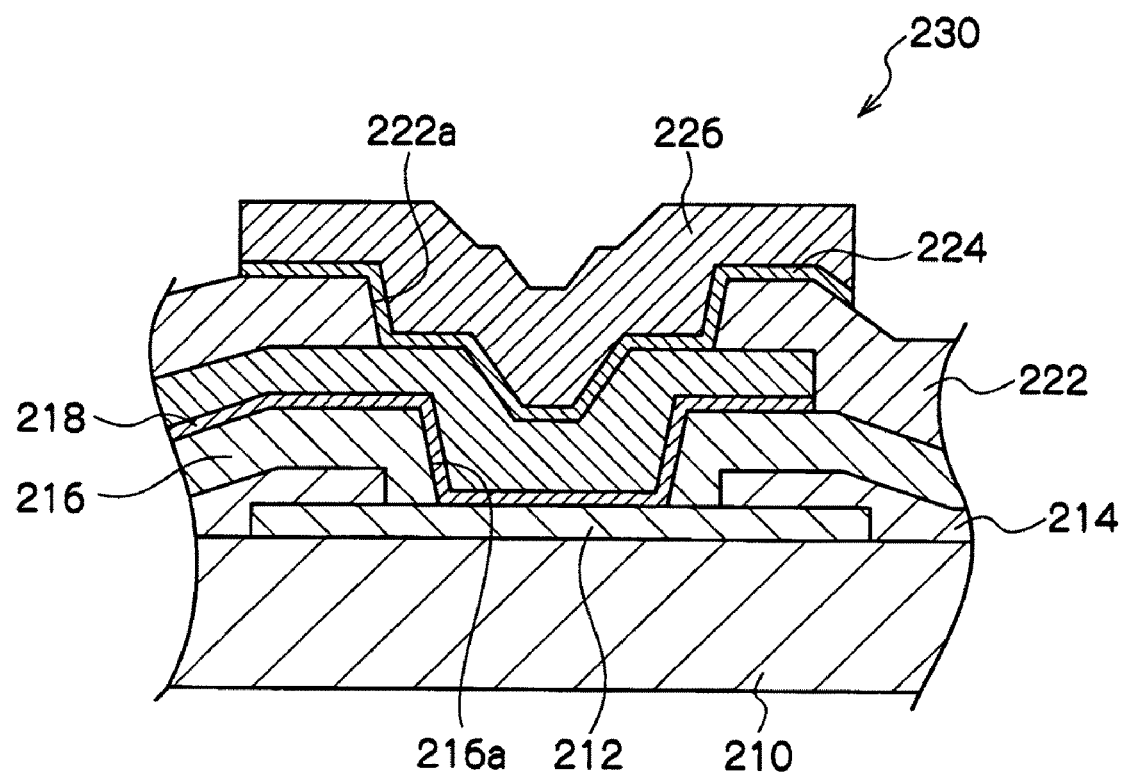
FIG. 46 is partial cross-section showing an example of a multilayered structure of a conventional semiconductor device.

FIG. 44 is a partial cross-section showing an example of a multilayered structure of a semiconductor device according to a sixth exemplary embodiment of the present invention. A semiconductor device 110 according to the sixth exemplary embodiment is, similar to the semiconductor device 100 according to the first exemplary embodiment (see FIG. 1), equipped with: a semiconductor wafer 10; an electrode pad 12; a passivation film 14; a first insulation layer 16; a first opening 16a; a first redistribution layer 20; a first via interconnect 20b; a second insulating layer 22; second openings 22a; a second redistribution layer 26; second via interconnects 26b; and a post electrode 28.

In the semiconductor device 110, the via portions of the first redistribution layer 20 and the second redistribution layer 26 are respectively superimposed on the electrode pad 12, configuring a stacked structure 30. In the present exemplary embodiment, a "two-stage sputtering method" is applied for the forming process of the first redistribution layer 20 similar to in the fourth exemplary embodiment, and a "two-stage sputtering method" is applied for the process for forming the second redistribution layer 26 similar to in the fifth exemplary embodiment. Similar portions to those of the semiconductor device 100 according to the first exemplary embodiment are allocated the same reference numerals and explanation thereof is abbreviated.

Explanation will now be given of the structure of the semiconductor device 110 according to the sixth exemplary embodiment, following the manufacturing processes thereof.

Processes for Forming the First Insulating Layer, First Redistribution Layer, and Second Insulating Layer Since the processes prior to the process for forming the second redistribution layer 26 (see FIG. 29 to FIG. 35) are substantially the same as those of the semiconductor device 106 according to the fourth exemplary embodiment, the same reference numerals are allocated and explanation thereof is abbreviated. Similar to in the fourth exemplary embodiment, the first via interconnect 20b and the first redistribution layer 20 are integrated together using a two-stage sputtering method.

Processes for Forming the Second Insulating Layer

Since the processes for forming the second redistribution layer 26 and subsequent processes (see FIG. 17 to FIG. 23) are similar to those of the semiconductor device 108 according to the fifth exemplary embodiment, the same reference numerals will be used and explanation simplified. Similar to in the fifth exemplary embodiment, the second redistribution layer 26 is formed after the second via interconnects 26b have been formed by a two-stage sputtering method so as to fill the second opening 22a. In the present exemplary embodiment too, the second via interconnect 26b is superimposed on the first via interconnect 20b, configuring the stacked structure 30.

Processes for Forming the Post Electrode

Next, similar to in the fifth exemplary embodiment, a post electrode 28 is formed to the main surface of the semiconductor wafer 10 formed with the second redistribution layer 26, and portions not required are removed. Thereby, the semiconductor device 110 according to the sixth exemplary embodiment is completed.

As explained above, in the sixth exemplary embodiment, due to the two-stage sputtering method, film forming defects, "fault-breaks" or the like, do not occur when the first redistribution layer 20 is being formed. Thereby, occurrences of poor electrical connection between the first redistribution layer 20 and the first via interconnect 20b are suppressed. Similarly, due to the two-stage sputtering method, film forming defects, "fault-breaks" or the like, do not occur when the second redistribution layer 26 is being formed. Thereby, occurrences of poor electrical connection between the second redistribution layer 26 and the second via interconnects 26b, and between the first via interconnect 20b and the second via interconnect 26b, are suppressed.

Furthermore, the surface of the first redistribution layer 20 is made substantially flat, the electrical contact with the via portion of the second redistribution layer 26 is improved, and also the surface of the second redistribution layer 26 is made substantially flat, further improving the electrical contact between the redistribution layer in the layer above and the via portion. At the same time, variation in the thickness of the redistribution layers overall is reduced.

Exemplary Modifications

Note that while explanation has been given in the above exemplary embodiments regarding a WCSP of a multilayer redistribution structure equipped with a stacked structure, the present invention may be applied to a WCSP of other multilayer redistribution structure. Whilst a more significant effect is exhibited in stacked structures with a large influence from the base substrate pattern, where a reduction in electrical properties readily develops due to film forming defects, "fault-breaks" or the like, occurring when forming redistribution wiring, film forming defects can also be reduced in WCSPs of other multilayer redistribution structures, and a reduction in electrical properties can also be suppressed therein.

Furthermore, while explanation has been given in the above exemplary embodiments of examples in which, for a single semiconductor device, the redistribution wiring was formed with one or other of "two-stage electroplating method" or the "two-stage sputtering method", the first redistribution layer may be formed with the "two-stage electroplating method" and the second redistribution layer may be formed with the "two-stage sputtering method". Furthermore, as mentioned in the fourth exemplary embodiment, the number of processes is increased by employing the "two-stage electroplating method" or the "two-stage sputtering method" in place of an ordinary electroplating method, however film forming defects can be reduced, and a reduction in electrical properties can be suppressed.

Furthermore, while a sputtering method has the merit of being able to form an even more uniform metal film by metal vacuum deposition, and can obtain interconnections with excellent electrical properties, such as Vt and the like, there is a disadvantage in that the production time becomes longer. Consequently, "ordinary electroplating methods", the "two-stage electroplating method" and the "two-stage sputtering method" are preferably applied in appropriate combinations according to the application and purpose.

Furthermore, the above exemplary embodiments are only examples of manufacturing processes, and manufacturing processes are not limited thereto. Obviously appropriate changes may be made to the sequence of the finer processes, as long as the same structure can be manufactured.

Furthermore, while explanation has been given in the above exemplary embodiments of examples where film forming defects, "fault-breaks" or the like, are prevented during forming redistribution wiring, there is no limitation to the film forming defects that are being prevented being those of redistribution wiring. Considering that undulations (base substrate patterns) in a lower layer change the thickness of the redistribution layer of the layer above, film forming defects are preferably prevented not only in the redistribution layer, but also in other layers than the redistribution layer.

What is claimed is:

1. A method of manufacturing a semiconductor device, the method comprising:
   preparing a semiconductor substrate formed with an electrode pad on a main surface side;
   forming a first insulating layer from an insulating material so as to cover the electrode pad and the semiconductor substrate, the first insulating layer provided with a first opening through which a portion of the electrode pad is exposed;
   forming a first redistribution layer on the first opening and on the first insulating layer from a first electrically conductive material;
   forming a second insulating layer from an insulating material, the second insulating layer provided with a second opening through which a portion of the first redistribution layer that is superimposed on the first opening is exposed, and the second insulating layer being formed so as to cover portions of the first redistribution layer other than those of the second opening and to cover the first insulating layer;
   forming a second redistribution layer on the second opening and on the second insulating layer from a second electrically conductive material; and
   first processing when forming the first redistribution layer, in which, the first electrically conductive material is filled in the first opening to form a via interconnect and thereafter the first redistribution layer is formed on the first insulating layer with the first electrically conductive material such that the first redistribution layer is electrically connected to the via interconnect, wherein the first processing includes
      forming a first electrically conductive layer containing the first electrically conductive material so as to cover the electrode pad and the first insulating layer,
      forming a resist film on the first electrically conductive layer other than in a region where the first opening is formed,
      filling the first electrically conductive material in the first opening to form the via interconnect by growing the first electrically conductive material using an electroplating method until a surface of the first electrically conductive material becomes higher than a surface of the first insulating layer,
      removing a part of the resist film to leave a remainder part of the resist film such that the first electrically conductive layer is exposed from the resist film in a region where the first redistribution layer is to be formed, and
      growing, in the exposed region, the first electrically conductive material on the first electrically conductive layer using an electroplating method to form the first redistribution layer to electrically connect to the via interconnect.

2. The method of claim 1, wherein the first processing comprising:
   depositing the first electrically conductive material so as to cover the electrode pad and the first insulating layer up to a height of the surface of the first insulating layer or higher;
   forming a resist film on the deposited film corresponding to the first opening;
   forming the via interconnect by employing the resist film to remove the first electrically conductive material on the surface of the first insulating layer; and
   forming the first redistribution layer electrically connected to the via interconnect by depositing the first electrically conductive material on the first insulating layer and on the via interconnect.

3. The method of claim 2 wherein the first electrically conductive material is deposited by sputtering.

4. The method of claim 1, wherein the first electrically conductive material and the second electrically conductive material each comprises copper.

5. The method of claim 1, further comprising second processing when forming the second redistribution layer, in which, the second electrically conductive material is filled in the second opening to form a second via interconnect and thereafter the second redistribution layer is formed on the second insulating layer with the second electrically conductive material such that the second redistribution layer is electrically connected to the second via interconnect.

6. The method of claim 5, wherein the second processing comprises:
   depositing the second electrically conductive material so as to cover the first redistribution layer and the first insulating layer up to the height of the surface of the second insulating layer or higher;

forming a resist film on the deposited film corresponding to the second opening;

forming the second via interconnect by employing the resist film to remove the second electrically conductive material on the surface of the second insulating layer; and forming the second redistribution layer electrically connected to the second via interconnect by depositing the second electrically conductive material on the second insulating layer and on the second via interconnect.

7. The method of claim 1, wherein the growing of the first electrically conductive material in the exposed region includes growing the first electrically conductive material between portions of the remainder part of the resist film.

8. A method of manufacturing a semiconductor device, the method comprising:

preparing a semiconductor substrate formed with an electrode pad on a main surface side;

forming a first insulating layer from an insulating material so as to cover the electrode pad and the semiconductor substrate, the first insulating layer provided with a first opening through which a portion of the electrode pad is exposed;

forming a first redistribution layer on the first opening and on the first insulating layer from a first electrically conductive material;

forming a second insulating layer from an insulating material, the second insulating layer provided with a second opening through which a portion of the first redistribution layer that is superimposed on the first opening is exposed, and the second insulating layer being formed so as to cover portions of the first redistribution layer other than those of the second opening and to cover the first insulating layer;

forming a second redistribution layer on the second opening and on the second insulating layer from a second electrically conductive material; and processing when forming the second redistribution layer, in which, the second electrically conductive material is filled in the second opening to form a via interconnect and thereafter the second redistribution layer is formed on the second insulating layer with the second electrically conductive material such that the second redistribution layer is electrically connected to the via interconnect, wherein the processing includes forming a second electrically conductive layer containing the second electrically conductive material so as to cover the first redistribution layer and the second insulating layer, forming a resist film on the second electrically conductive layer other than in a region where the second opening is formed, filling the second electrically conductive material in the second opening to form the via interconnect by growing the second electrically conductive material using an electroplating method until a surface of the second electrically conductive material becomes higher than a surface of the second insulating layer, removing a part of the resist film to leave a remainder part of the resist film such that the second electrically conductive layer is exposed from the resist film in a region where the second redistribution layer is to be formed, and growing, in the exposed region, the second electrically conductive material on the second electrically conductive layer using an electroplating method to form the second redistribution layer to electrically connect to the via interconnect.

9. The method of claim 8, wherein the first electrically conductive material and the second electrically conductive material each comprises copper.

10. The method of claim 8, further comprising another processing when forming the first redistribution layer, in which, the first electrically conductive material is filled in the first opening to form another via interconnect and thereafter the first redistribution layer is formed on the first insulating layer with the first electrically conductive material such that the first redistribution layer is electrically connected to the another via interconnect.

11. The method of claim 8, wherein the growing of the second electrically conductive material in the exposed region includes growing the second electrically conductive material between portions of the remainder part of the resist film.

\* \* \* \* \*